(12) United States Patent
Ueno

(10) Patent No.: US 11,158,257 B2
(45) Date of Patent: Oct. 26, 2021

(54) DISPLAY DEVICE AND DRIVING METHOD FOR SAME

(71) Applicant: SHARP KABUSHIKI KAISHA, Sakai (JP)

(72) Inventor: Tetsuya Ueno, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/977,800

(22) PCT Filed: Mar. 19, 2018

(86) PCT No.: PCT/JP2018/010692
§ 371 (c)(1),
(2) Date: Sep. 2, 2020

(87) PCT Pub. No.: WO2019/180759
PCT Pub. Date: Sep. 26, 2019

(65) Prior Publication Data
US 2020/0402457 A1 Dec. 24, 2020

(51) Int. Cl.
*G09G 3/3233* (2016.01)
*G09G 3/3266* (2016.01)
*G09G 3/3291* (2016.01)
*H01L 27/32* (2006.01)

(52) U.S. Cl.
CPC ......... *G09G 3/3233* (2013.01); *G09G 3/3266* (2013.01); *G09G 3/3291* (2013.01); *H01L 27/3276* (2013.01)

(58) Field of Classification Search
CPC .. G09G 3/3233; G09G 3/3266; G09G 3/3291; G09G 3/3258; H01L 27/3276
See application file for complete search history.

(56) References Cited

U.S. PATENT DOCUMENTS

| | | | |
|---|---|---|---|
| 8,836,618 B2* | 9/2014 | Liu | G09G 3/32 345/77 |
| 9,165,503 B2* | 10/2015 | Shih | G09G 3/3258 |
| 10,139,958 B2* | 11/2018 | Ding | G09G 3/3233 |
| 2016/0155379 A1 | 6/2016 | Na | |

FOREIGN PATENT DOCUMENTS

JP 2016-110055 A 6/2016

* cited by examiner

*Primary Examiner* — Sardis F Azongha
(74) *Attorney, Agent, or Firm* — ScienBiziP, P.C.

(57) ABSTRACT

An object of the disclosure is to achieve a current-driven display device able to compensate for a variation in threshold voltage of a drive transistor without causing a variation in luminance.
A pixel circuit includes a light-emitting element, a drive transistor, a power supply control transistor, a light emission control transistor, a first writing control transistor, a threshold voltage compensation transistor, a second writing control transistor, an initialization transistor, and a data-holding capacitor. During a data writing period, a scanning signal is active, an initialization voltage is supplied to a first electrode of the data-holding capacitor via the drive transistor, and a data voltage is supplied to a second electrode of the data-holding capacitor.

14 Claims, 27 Drawing Sheets

DISPLAY DEVICE AND DRIVING METHOD FOR SAME

TECHNICAL FIELD

The present disclosure relates to a display device, and more specifically relates to a display device including a current-driven display element, such as an organic EL display device, and a driving method for the stated display device.

BACKGROUND ART

In recent years, organic EL display devices provided with pixel circuits including organic electro luminescence elements (hereinafter referred to as "organic EL elements") have been coming into practical use. The organic EL element is a self-luminous display element that emits light with luminance according to an amount of a current flowing through the organic EL element. The organic EL display device using the organic EL elements being self-luminous display elements can be easily thinned in size, reduced in power consumption, increased in luminance, and the like, as compared with a liquid crystal display device requiring backlights, color filters, and the like. Therefore, development of the organic EL display device has been aggressively advanced in recent years.

With regard to the pixel circuit of the organic EL display device, a thin film transistor (TFT) is typically used as a drive transistor, which is a transistor for controlling the supply of a current to the organic EL element. However, a variation in characteristics of the TFT is likely to occur. Specifically, a variation in threshold voltage is likely to occur. When the variation in threshold voltage occurs in the drive transistors provided in a display portion, a variation in luminance occurs and thus the display quality is degraded. Accordingly, various types of processing (compensation processing) configured to compensate for threshold voltage variations have been proposed.

As the compensation processing methods, well-known are an internal compensation method in which compensation processing is performed by providing a capacitor in a pixel circuit to hold the threshold voltage information of the drive transistor, and an external compensation method in which, for example, an amount of a current flowing through the drive transistor is measured under predetermined conditions with a circuit provided outside the pixel circuit, and compensation processing is performed by correcting a video signal based on the measurement result.

For example, a configuration illustrated in FIG. 26 is known as a configuration of a pixel circuit of an organic EL display device employing the internal compensation method for compensation processing. Note that a pixel circuit 90 illustrated in FIG. 26 is assumed to be a pixel circuit located in the n-th row. The pixel circuits 90 includes one light-emitting element OLED, seven transistors T91 to T97 (a drive transistor T91, a writing control transistor T92, a power supply control transistor T93, a light emission control transistor T94, a threshold voltage compensation transistor T95, a first initialization transistor T96, and a second initialization transistor T97), and one data-holding capacitor C9. To the pixel circuit 90, three types of voltages of fixed magnitude (a high-level power supply voltage ELVDD, a low-level power supply voltage ELVSS, and an initialization voltage Vini) are supplied, and additionally supplied are a scanning signal G(n) to be applied to a scanning signal line of the n-th row, a scanning signal G(n−1) to be applied to a scanning signal line of the (n−1)-th row, a light emission control signal EM(n) to be applied to a light emission control line of the n-th row, and a data signal D.

In the pixel circuit 90 illustrated in FIG. 26, after initialization processing has been performed, the writing control transistor T92 and the threshold voltage compensation transistor T95 are turned on, and the power supply control transistor T93, the light emission control transistor T94, the first initialization transistor T96, and the second initialization transistor T97 are turned off, whereby data writing (charging of the data-holding capacitor C9 based on the data signal D) is performed. At this time, as indicated by an arrow denoted by a reference sign 91 in FIG. 27, a data voltage (voltage of the data signal D) is applied to one of the electrodes of the data-holding capacitor C9 via the drive transistor T91, and the high-level power supply voltage ELVDD is applied to the other one of the electrodes of the data-holding capacitor C9 as indicated by an arrow denoted by a reference sign 92 in FIG. 27. By the data being written in this manner, the magnitude of a gate voltage Vg of the drive transistor T91 is expressed by Equation (1) below:

$$Vg = V\text{data} - V\text{th} \tag{1}$$

where Vdata is the data voltage, and Vth is a threshold voltage (absolute value) of the drive transistor T91.

After the writing of the data, a drive current Ioled is supplied to the light-emitting element OLED by changing the writing control transistor T92 and the threshold voltage compensation transistor T95 to an off state and changing the power supply control transistor T93 and the light emission control transistor T94 to an on state. As a result, the light-emitting element OLED emits light according to the size of the drive current Ioled. At this time, the size of the drive current Ioled is expressed by Equation (2) below:

$$\text{Ioled} = (\beta/2) \cdot (Vgs - V\text{th})^2 \tag{2}$$

where $\beta$ represents a constant, and Vgs is a source-gate voltage of the drive transistor T91.

When the above Equation (1) is taken into consideration, the source-gate voltage Vgs of the drive transistor T91 is expressed by Equation (3) below.

$$Vgs = \text{ELVDD} - Vg = \text{ELVDD} - V\text{data} + V\text{th} \tag{3}$$

When the above Equation (3) is substituted in the above Equation (2), Equation (4) below is obtained.

$$\text{Ioled} = \beta/2 \cdot (\text{ELVDD} - V\text{data})^2 \tag{4}$$

The above Equation (4) does not contain the term of the threshold voltage Vth. In other words, regardless of the magnitude of the threshold voltage Vth of the drive transistor T91, the drive current Ioled according to the magnitude of the data voltage Vdata is supplied to the light-emitting element OLED. In this way, a variation in the threshold voltage Vth of the drive transistor T91 is compensated.

JP 2016-110055 A discloses an organic EL display device that is so configured as to secure sufficient time for compensation processing.

CITATION LIST

Patent Literature

PTL 1: JP 2016-110055 A

SUMMARY

Technical Problem

According to the known organic EL display device (the organic EL display device including the pixel circuit 90 in the configuration illustrated in FIG. 26) employing the internal compensation method for compensation processing, data writing is performed in a state in which the high-level power supply voltage ELVDD is applied to one end of the data-holding capacitor C9. However, the magnitude of the high-level power supply voltage ELVDD varies depending on a display pattern, pixel positions, and the like. This is because the magnitude of an IR drop (a voltage drop by the product of a current I and a wiring line resistance R), which affects the high-level power supply voltage ELVDD, differs depending on the display pattern, the pixel positions, and the like. More specifically, since the amount of the current I changes when the display pattern changes, the magnitude of the high-level power supply voltage ELVDD varies depending on the display pattern. In addition, since the magnitude of the wiring line resistance R differs depending on the pixel positions, the magnitude of the high-level power supply voltage ELVDD varies depending on the pixel positions. As discussed above, the luminance may be different despite the data voltage Vdata being the same.

Therefore, an object of the following disclosure is to achieve a current-driven display device able to compensate for a variation in threshold voltage of a drive transistor without causing a variation in luminance.

Solution to Problem

A display device according to some embodiments of the disclosure is a display device that includes a pixel circuit arranged in a matrix shape, a first power source wiring line supplied with a first power supply voltage, a second power source wiring line provided with a second power supply voltage, an initialization power source wiring line supplied with an initialization voltage for initializing the pixel circuit, and a data signal line provided for each column and supplied with a data voltage, the pixel circuit including:

a display element that is provided between the first power source wiring line and the second power source wiring line, and emits light with luminance in accordance with an amount of a current supplied;

a capacitance element having a first electrode and a second electrode;

a drive transistor that is provided to be connected in series to the display element between the first power source wiring line and the second power source wiring line, and has a control terminal connected to the first electrode of the capacitance element, a first conduction terminal to be supplied with the first power supply voltage during a light emission period, and a second conduction terminal that is electrically connected to the control terminal during a data writing period, and is electrically disconnected from the control terminal during a light emission period;

an initialization transistor having a control terminal to be supplied with a signal that becomes active during an initialization period, a first conduction terminal connected to a wiring line between the control terminal and the second conduction terminal of the drive transistor, and a second conduction terminal connected to the initialization power source wiring line;

a first writing control transistor having a control terminal to be supplied with a signal that becomes active during a data writing period, a first conduction terminal connected to the data signal line, and a second conduction terminal connected to the second electrode of the capacitance element; and a second writing control transistor having a control terminal to be supplied with a signal that becomes active during a data writing period, a first conduction terminal connected to the initialization power source wiring line, and a second conduction terminal connected to the first conduction terminal of the drive transistor.

A driving method for a display device according to some embodiments of the disclosure is a driving method for a display device equipped with a pixel circuit including a display element that is provided between a first power source wiring line supplied with a first power supply voltage and a second power source wiring line supplied with a second power supply voltage, and emits light with luminance in accordance with an amount of a current supplied; a capacitance element having a first electrode and a second electrode; a drive transistor that is provided to be connected in series to the display element between the first power source wiring line and the second power source wiring line, and has a first conduction terminal, a second conduction terminal, and a control terminal connected to the first electrode of the capacitance element; and a light emitting controller configured to control a current supply to the display element, the driving method including:

supplying an initialization voltage to the control terminal of the drive transistor as initialization processing in a state of the current supply to the display element being blocked by the light emitting controller;

supplying the initialization voltage to the first electrode of the capacitance element via the drive transistor and supplying a data voltage to the second electrode of the capacitance element as data writing processing in the state of the current supply to the display element being blocked by the light emitting controller; and electrically connecting the first power source wiring line and the second power source wiring line by the light emitting controller in such a manner as to supply the current to the display element, as light emission processing.

Advantageous Effects of Disclosure

According to some embodiments of the disclosure, writing of data into the pixel circuit is performed by applying the data voltage to the second electrode of the capacitance element (data-holding capacitor) in a state of the initialization voltage being applied to the first electrode of the capacitance element via the drive transistor. In this regard, the amount of the current flowing through the initialization power source wiring line that transfers the initialization voltage is significantly smaller than the amount of the current flowing through the first power source wiring line that transfers the first power supply voltage (high-level power supply voltage). Therefore, as for the initialization voltage, a variation in the magnitude of voltage is small. That is, writing of data to the capacitance element is performed by applying the data voltage to the electrode (second electrode) opposing the electrode (first electrode) to which a substantially constant voltage is applied. This makes it possible to perform stable data writing. With this, the occurrence of a variation in luminance is prevented when the data is written based on the data voltage of the same magnitude. The size of the drive current depends on the magnitude of the threshold voltage of the drive transistor, and prior to the light emission of the display element (for example, an organic EL element), a voltage corresponding to the data voltage and the threshold voltage of the drive transistor is held in the capacitance element. As a result, when the display element emits light, the influence of the threshold voltage is canceled, and the drive current of a size corresponding to the data voltage is supplied to the display element. That is, the variation in the threshold voltage of the drive transistor is compensated. As described above, a current-driven display device able to compensate for the variation in the threshold voltage of the drive transistor is achieved without causing a variation in luminance.

DESCRIPTION OF EMBODIMENTS

Embodiments will be described below with reference to the accompanying drawings. Note that the following description is based on the premise that i and j each represent an integer equal to or greater than 2, and n represents an integer from 1 to i.

1. First Embodiment

1.1 Overall Configuration

Figure 2:
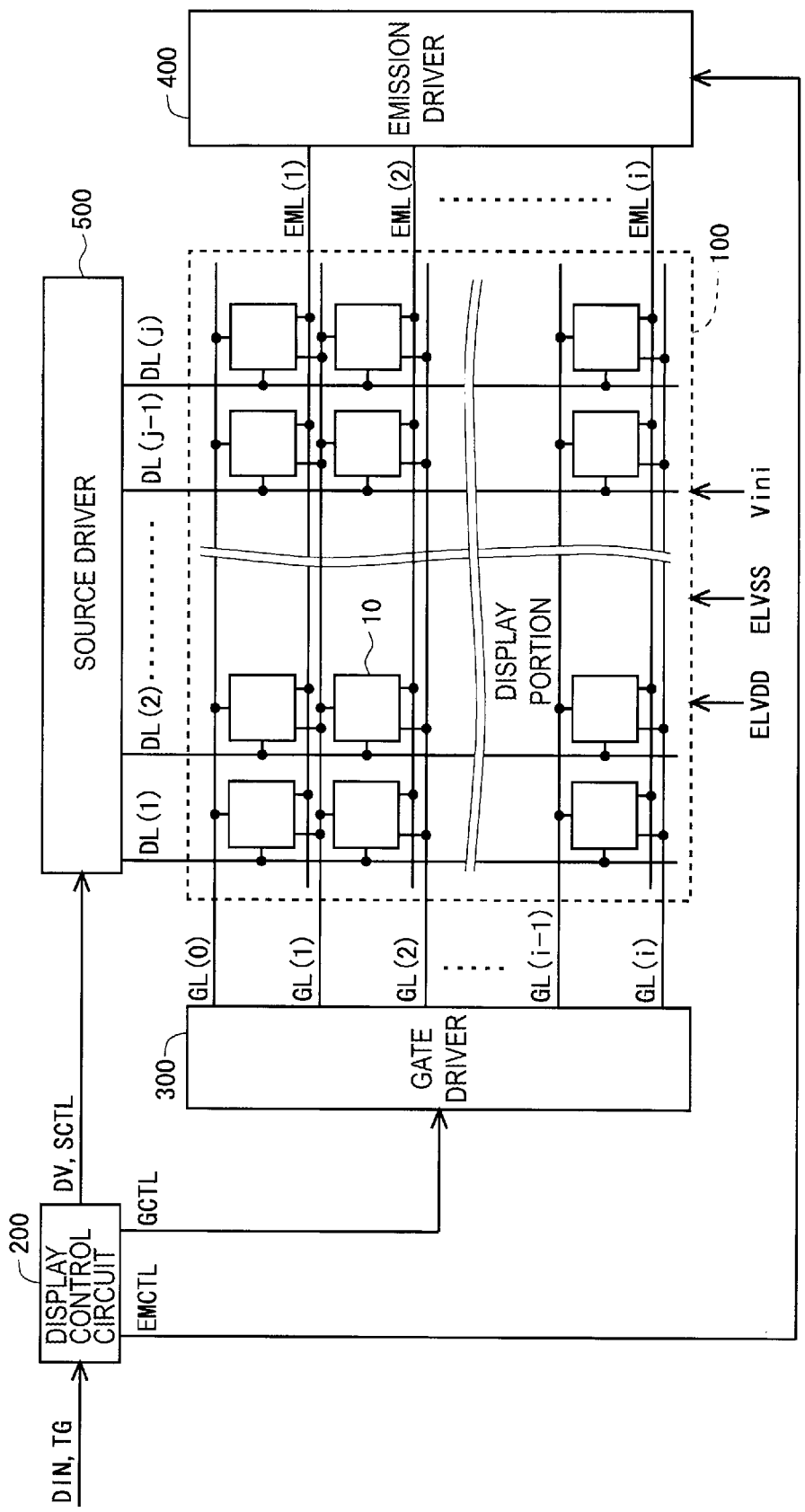
FIG. 2 is a block diagram illustrating an overall configuration of an organic EL display device in the first embodiment.

FIG. 2 is a block diagram illustrating the overall configuration of an organic EL display device according to a first embodiment. The organic EL display device includes a display portion 100, a display control circuit 200, a gate driver 300, an emission driver 400, and a source driver 500. For example, the gate driver 300 and the emission driver 400, in addition to the display portion 100, are provided inside an organic EL panel, and the display control circuit 200 and the source driver 500 are provided on a substrate outside the organic EL panel.

In the display portion 100, (i+1) scanning signal lines GL(0) to GL(i) and j data signal lines DL(1) to DL(j) orthogonal to these scanning signal lines are disposed. Further, in the display portion 100, i light emission control lines EML(1) to EML(i) are so disposed as to correspond to i scanning signal lines GL(1) to GL(i) excluding the scanning signal line GL(0), on a one-to-one basis. Inside the display portion 100, the scanning signal lines GL(0) to GL(i) and the light emission control lines EML(1) to EML(i) are typically parallel to each other. In the display portion 100, (i×j) pixel circuits 10 are so provided in a matrix shape as to correspond to intersections between the i scanning signal lines GL(1) to GL(i) excluding the scanning signal line GL(0), and the j data signal lines DL(1) to DL(j). In this way, a pixel matrix of i rows by j columns is formed in the display portion 100 by the (i×j) pixel circuits 10 being provided. Details of the pixel circuit 10 will be described later.

Each of the pixel circuits 10 is fixedly supplied with three kinds of voltages (a high-level power supply voltage ELVDD, a low-level power supply voltage ELVSS, and an initialization voltage Vini) by using wiring lines (not illustrated). In the following, a wiring line that transfers the high-level power supply voltage ELVDD is referred to as a "first power source wiring line", a wiring line that transfers the low-level power supply voltage ELVSS is referred to as a "second power source wiring line", and a wiring line that transfers the initialization voltage Vini is referred to as an "initialization power source wiring line". The high-level power supply voltage ELVDD corresponds to a first power supply voltage, and the low-level power supply voltage ELVSS corresponds to a second power supply voltage.

Actions of the constituent elements illustrated in FIG. 2 will be described below. The display control circuit 200 receives an input image signal DIN and a timing signal group (a horizontal synchronization signal, a vertical synchronization signal, and the like) TG transmitted from the outside, and outputs a digital video signal DV, a gate control signal GCTL for controlling the actions of the gate driver 300, an emission driver control signal EMCTL for controlling the actions of the emission driver 400, and a source control signal SCTL for controlling the actions of the source driver 500. The gate control signal GCTL and the emission driver control signal EMCTL each include a start pulse signal and a clock signal. The source control signal SCTL includes a start pulse signal (a source start pulse signal), a clock signal (a source clock signal), a latch strobe signal, and the like.

The gate driver 300 is connected with the i scanning signal lines GL(1) to GL(i). The gate driver 300 includes a shift register, a logic circuit, and the like. The gate driver 300 drives the i scanning signal lines GL(1) to GL(i) based on the gate control signal GCTL outputted from the display control circuit 200. More specifically, the gate driver 300 sequentially selects one scanning signal line from among the i scanning signal lines GL(1) to GL(i), and applies an active scanning signal (in the present embodiment, a low-level scanning signal) to the selected scanning signal line.

The emission driver 400 is connected with the i light emission control lines EML(1) to EML(i). The emission driver 400 includes a shift register, a logic circuit, and the like. The emission driver 400 drives the i light emission control lines EML(1) to EML(i) based on the emission driver control signal EMCTL outputted from the display control circuit 200. More specifically, the emission driver 400 sequentially selects one light emission control line from among the i light emission control lines EML(1) to EML(i), and applies an active light emission control signal (in the present embodiment, a low-level light emission control signal) to the selected light emission control line.

The source driver 500 is connected with the j data signal lines DL(1) to DL(j). The source driver 500 receives the digital video signal DV and the source control signal SCTL outputted from the display control circuit 200, and applies data signals to the j data signal lines DL(1) to DL(j). The source driver 500 includes an j-bit shift register, a sampling circuit, a latch circuit, j D/A converters, and the like, which are not illustrated. The shift register includes j registers cascade-connected with each other. The shift register sequentially transfers a pulse of the source start pulse signal to be supplied to a first stage register from an input end to an output end based on the source clock signal. In response to this pulse transferring, sampling pulses are output from respective stages of the shift register. The sampling circuit stores the digital video signal DV based on the sampling pulses. The latch circuit acquires and holds the digital video signal DV for one row stored in the sampling circuit in accordance with the latch strobe signal. The D/A converters are provided to correspond to the respective data signal lines DL(1) to DL(j). The D/A converters convert the digital video signal DV held in the latch circuit into analog voltages. The converted analog voltages are simultaneously applied, as data signals, to all of the data signal lines DL(1) to DL(j).

As described above, the i scanning signal lines GL(1) to GL(i), the i light emission control lines EML(1) to EML(i), and the j data signal lines DL(1) to DL(j) are driven to display the image based on the input image signal DIN on the display portion 100.

Note that in the following, a scanning signal supplied to the scanning signal line GL(n) of the n-th row is denoted by a reference sign G(n), a scanning signal supplied to the scanning signal line GL(n−1) of the (n−1) row is denoted by a reference sign G(n−1), and a light emission control signal supplied to the light emission control line EML(n) of the n-th row is denoted by a reference sign EM(n).

1.2 Configuration of Pixel Circuit

Figure 1:
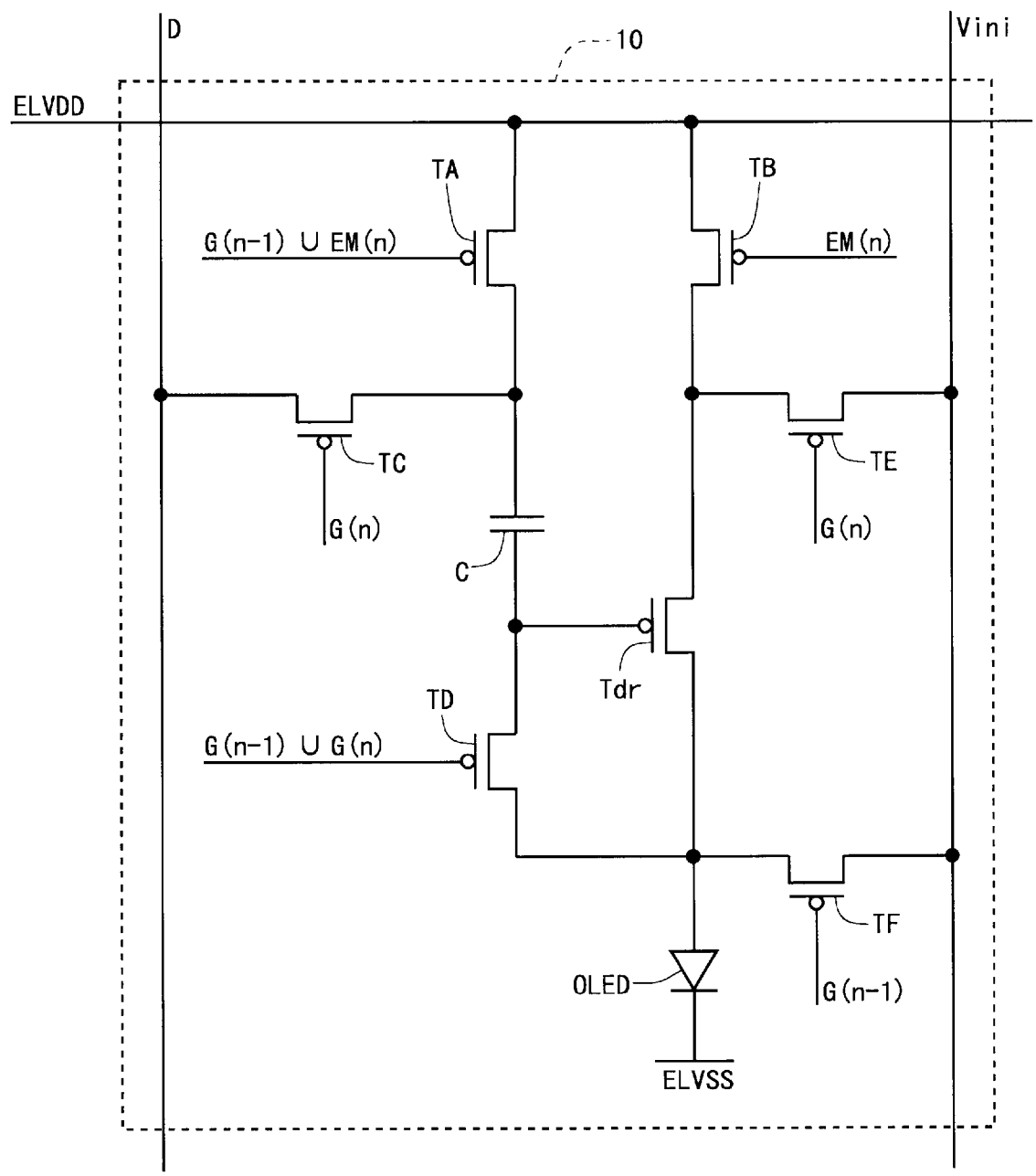
FIG. 1 is a circuit diagram illustrating a configuration of a pixel circuit in a first embodiment.

Next, a configuration of the pixel circuit 10 in the present embodiment will be described while referring to FIG. 1. Here, the pixel circuit 10 located in the n-th row is focused on. The pixel circuit 10 includes one light-emitting element OLED, seven transistors (a drive transistor Tdr, a power supply control transistor TA, a light emission control transistor TB, a first writing control transistor TC, a threshold voltage compensation transistor TD, a second writing control transistor TE, and an initialization transistor TF), and one capacitance element (hereinafter referred to as a "data-holding capacitor") C. The above-mentioned seven transistors are all p-channel thin film transistors. The data-holding capacitor C is a capacitance element including two electrodes (a first electrode and a second electrode).

Regarding the p-channel transistor, of terminals of a drain and a source, the terminal having a higher potential is referred to as "source". However, in some transistors within the pixel circuit 10, the relationship of potential levels between two terminals other than a gate terminal (a control terminal) is interchanged depending on circuit conditions. Accordingly, as for each of the transistors in the pixel circuit 10, in the following description, one of the two terminals other than the gate terminal is referred to as a "first conduction terminal", and the other one is referred to as a "second conduction terminal".

As for the drive transistor Tdr, the gate terminal is connected to the first electrode of the data-holding capacitor C and the second conduction terminal of the threshold voltage compensation transistor TD, the first conduction terminal is connected to the second conduction terminal of the light emission control transistor TB and the second conduction terminal of the second writing control transistor TE, and the second conduction terminal is connected to the first conduction terminal of the threshold voltage compensation transistor TD, the first conduction terminal of the initialization transistor TF, and an anode terminal of the light-emitting element OLED. As for the power supply control transistor TA, the gate terminal is connected to a wiring line (hereinafter referred to as a "first logical-sum signal wiring line") that transfers a signal representative of a logical sum of the scanning signal G(n−1) and the light emission control signal EM(n), the first conduction terminal is connected to the first power source wiring line, and the second conduction terminal is connected to the second electrode of the data-holding capacitor C and the second conduction terminal of the first writing control transistor TC. As for the light emission control transistor TB, the gate terminal is connected to the light emission control line EML(n), the first conduction terminal is connected to the first power source wiring line, and the second conduction terminal is connected to the first conduction terminal of the drive transistor Tdr and the second conduction terminal of the second writing control transistor TE.

As for the first writing control transistor TC, the gate terminal is connected to the scanning signal line GL(n), the first conduction terminal is connected to the data signal line DL, and the second conduction terminal is connected to the second conduction terminal of the power supply control transistor TA and the second electrode of the data-holding capacitor C. As for the threshold voltage compensation transistor TD, the gate terminal is connected to a wiring line (hereinafter referred to as a "second logical-sum signal wiring line") that transfers a signal representative of a logical sum of the scanning signal G(n−1) and the scanning signal G(n), the first conduction terminal is connected to the second conduction terminal of the drive transistor Tdr, the first conduction terminal of the initialization transistor TF and the anode terminal of the light-emitting element OLED, and the second conduction terminal is connected to the gate terminal of the drive transistor Tdr and the first electrode of the data-holding capacitor C. As for the second writing control transistor TE, the gate terminal is connected to the scanning signal line GL(n), the first conduction terminal is connected to the initialization power source wiring line, and the second conduction terminal is connected to the first conduction terminal of the drive transistor Tdr and the second conduction terminal of the light emission control transistor TB. As for the initialization transistor TF, the gate terminal is connected to the scanning signal line GL(n−1), the first conduction terminal is connected to the second conduction terminal of the drive transistor Tdr, the first conduction terminal of the threshold voltage compensation transistor TD and the anode terminal of the light-emitting element OLED, and the second conduction terminal is connected to the initialization power source wiring line.

As for the data-holding capacitor C, the first electrode is connected to the gate terminal of the drive transistor Tdr and the second conduction terminal of the threshold voltage compensation transistor TD, and the second electrode is connected to the second conduction terminal of the power supply control transistor TA and the second conduction terminal of the first writing control transistor TC. As for the light-emitting element OLED, the anode terminal is connected to the second conduction terminal of the drive transistor Tdr, the first conduction terminal of the threshold voltage compensation transistor TD and the first conduction terminal of the initialization transistor TF, and a cathode terminal is connected to the second power source wiring line.

As described above, as for the pixel circuit 10 located in the n-th row, the scanning signal G(n−1) to be applied to the scanning signal line GL(n−1) of the (n−1)-th row is supplied to the gate terminal of the initialization transistor TF, the scanning signal G(n) to be applied to the scanning signal line GL(n) of the n-th row is supplied to the gate terminal of the first writing control transistor TC and the gate terminal of the second writing control transistor TE, the light emission control signal EM(n) to be applied to the light emission control line EML(n) of the n-th row is supplied to the gate terminal of the light emission control transistor TB, the signal representative of a logical sum of the scanning signal G(n−1) and the scanning signal G(n) is supplied to the gate terminal of the threshold voltage compensation transistor TD, and the signal representative of a logical sum of the scanning signal G(n−1) and the light emission control signal EM(n) is supplied to the gate terminal of the power supply control transistor TA.

In the present embodiment, a light emitting controller is implemented by the light emission control transistor TB, a power supply controller is implemented by the power supply control transistor TA, and a threshold voltage compensator is implemented by the threshold voltage compensation transistor TD.

It is preferable that, of the seven transistors in the pixel circuit 10, the power supply control transistor TA, the light emission control transistor TB, the first writing control transistor TC, and the second writing control transistor TE employ a TFT of a double gate structure so as to reduce an off-leak current.

Figure 3:
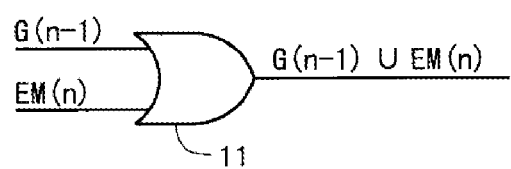
FIG. 3 is a diagram for describing an OR circuit configured to generate a signal to be supplied to a gate terminal of a power supply control transistor in the first embodiment.

In order to generate a signal to be supplied to the gate terminal of the power supply control transistor TA, an OR circuit 11 as illustrated in FIG. 3, in which the scanning signal G(n−1) is supplied to one of the input terminals and the light emission control signal EM(n) is supplied to the other one of the input terminals, is provided, for example, in the vicinity of an end portion of the display portion 100.

Figure 4:
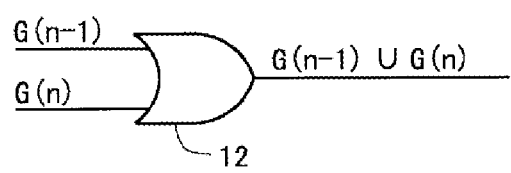
FIG. 4 is a diagram for describing an OR circuit configured to generate a signal to be supplied to a gate terminal of a threshold voltage compensation transistor in the first embodiment.

Likewise, in order to generate a signal to be supplied to the gate terminal of the threshold voltage compensation transistor TD, an OR circuit 12 as illustrated in FIG. 4, in which the scanning signal G(n−1) is supplied to one of the input terminals and the scanning signal G(n) is supplied to the other one of the input terminals, is provided, for example, in the vicinity of an end portion of the display portion 100. The output terminal of the OR circuit 11 is connected to the first logical-sum signal wiring line described above, and the output terminal of the OR circuit 12 is connected to the second logical-sum signal wiring line described above. A known configuration may be adopted for the specific internal configuration of the OR circuit 11 and the OR circuit 12. Note that the symbol of "u" in FIG. 1, FIG. 3, and the like represents an output of a logical sum (logical sum of two signal values).

In the present embodiment, each circuit operates in the mode of an active low. Therefore, when at least one of the scanning signal G(n−1) and the light emission control signal EM(n) is at a low level, the output signal from the OR circuit 11 (the signal representing the logical sum of the scanning signal G(n−1) and the light emission control signal EM(n)) is set to be at a low level. When at least one of the scanning signal G(n−1) and the scanning signal G(n) is at a low level, the output signal from the OR circuit 12 (the signal representing the logical sum of the scanning signal G(n−1) and the scanning signal G(n)) is set to be at a low level.

Since the OR circuit 11 and the OR circuit 12 discussed above are provided for each row, in the present embodiment, i first logical-sum signal wiring lines and i second logical-sum signal wiring lines are disposed in the display portion 100 (however, they are omitted in FIG. 2).

1.3 Driving Method

Figure 5:
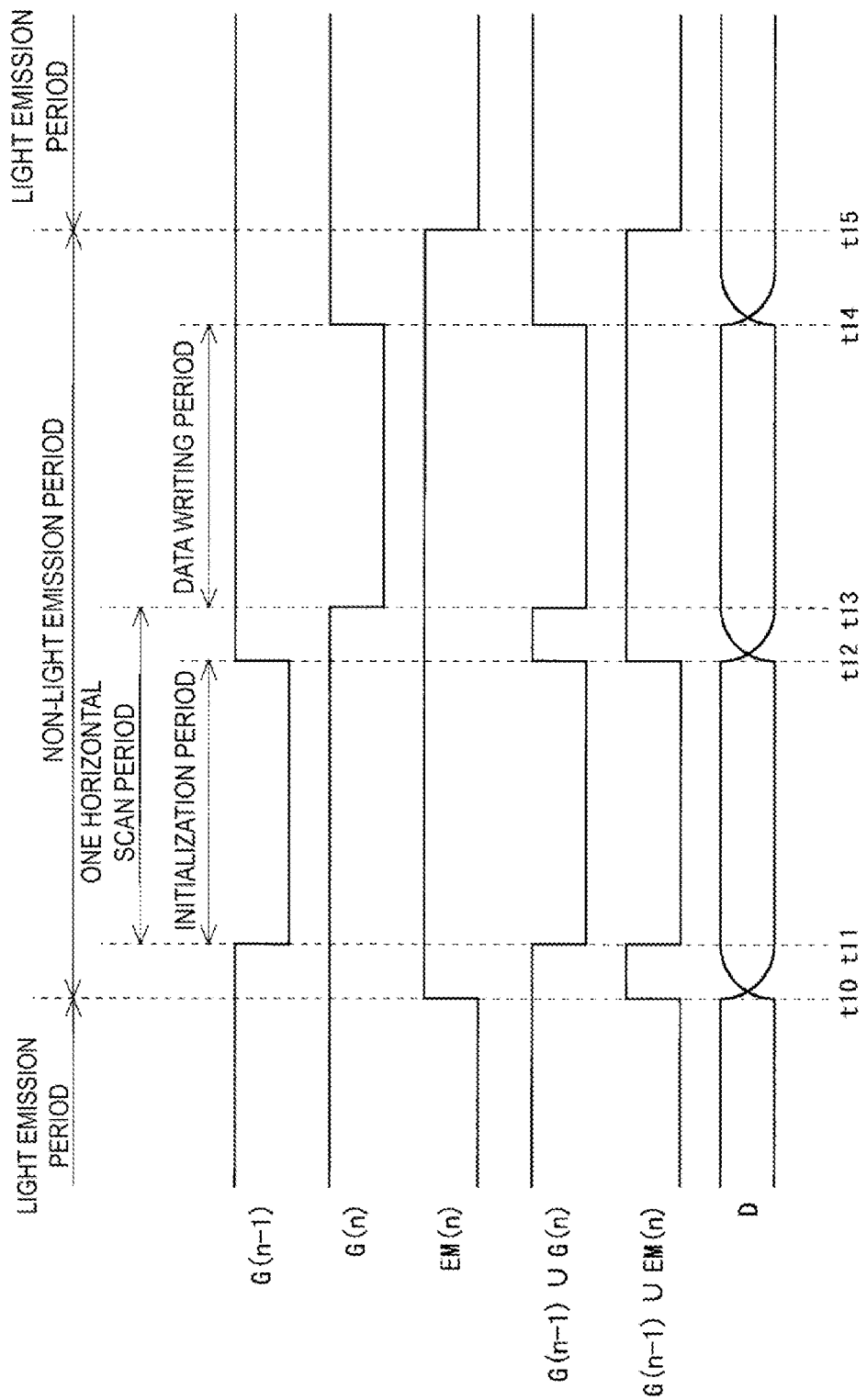
FIG. 5 is a timing chart for describing a driving method for a pixel circuit in the first embodiment.

Next, a driving method will be described. FIG. 5 is a timing chart for describing a driving method for the pixel circuit (the pixel circuit illustrated in FIG. 1) 10 located in the n-th row. With regard to FIG. 5, a period before time t10 and a period after time t15 are light emission periods of the pixel circuit 10 located in the n-th row, and a period from the time t10 to the time t15 are a non-light emission period of the pixel circuit 10 located in the n-th row. Focusing on the non-light emission period, a period from time t11 to time t12 is an initialization period, and a period from time t13 to time t14 is a data writing period. As can be understood from FIG. 5, the scanning signal G(n−1) is a signal that is active during the initialization period, the scanning signal G(n) is a signal that is active during the data writing period, and the light emission control signal EM(n) is a signal that is active during the light emission period.

In the period before the time t10, the scanning signal G(n−1) and the scanning signal G(n) are at a high level, and the light emission control signal EM(n) is at a low level. At this time, the power supply control transistor TA and the light emission control transistor TB are in an on state, while the first writing control transistor TC, the threshold voltage compensation transistor TD, the second writing control transistor TE, and the initialization transistor TF are in an off state. As a result, a drive current of a size corresponding to the voltage between the first conduction terminal and the gate terminal of the drive transistor Tdr is supplied to the light-emitting element OLED, so that the light-emitting element OLED emits light.

At the time t10, the light emission control signal EM(n) is changed from the low level to the high level. This turns the power supply control transistor TA and the light emission control transistor TB to the off state. As a result, the supply of the current to the light-emitting element OLED is blocked, so that the light-emitting element OLED is turned to the non-emitting (switch-off) state.

Figure 6:
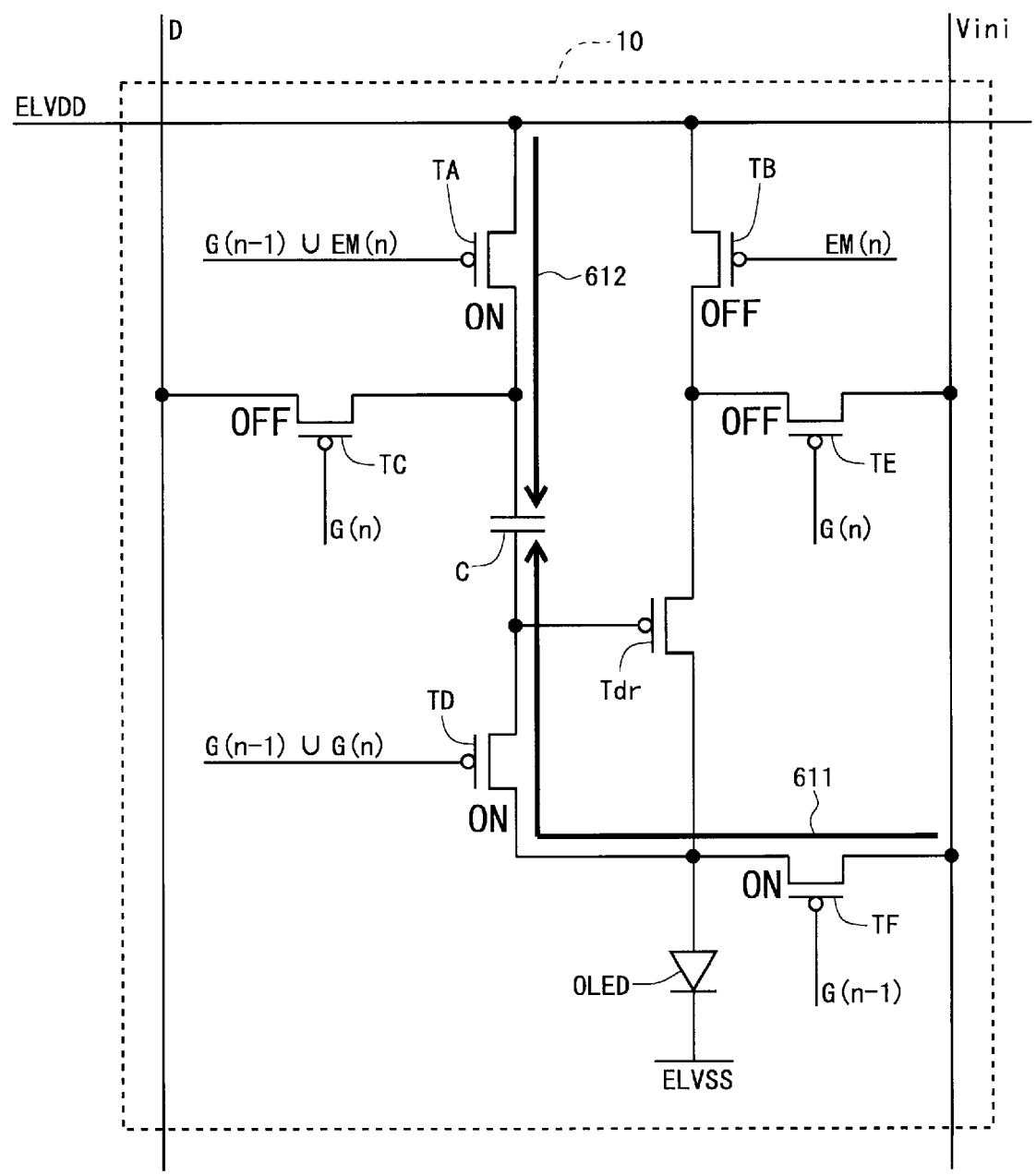
FIG. 6 is a diagram for describing actions in an initialization period in the first embodiment.

At the time t11, the scanning signal G(n−1) is changed from the high level to the low level. This turns the power supply control transistor TA, the threshold voltage compensation transistor TD, and the initialization transistor TF to the on state. By turning on the threshold voltage compensation transistor TD and the initialization transistor TF, the initialization voltage Vini is applied to the first electrode of the data-holding capacitor C, as indicated by an arrow denoted by a reference sign 611 in FIG. 6. In addition, by turning on the power supply control transistor TA, the high-level power supply voltage ELVDD is applied to the second electrode of the data-holding capacitor C, as indicated by an arrow denoted by a reference sign 612 in FIG. 6. As a result, a voltage of the magnitude of "ELVDD−Vini" is held in the data-holding capacitor C. In this manner, the gate voltage of the drive transistor Tdr is initialized.

At the time t12, the scanning signal G(n−1) is changed from the low level to the high level. This turns the power supply control transistor TA, the threshold voltage compensation transistor TD, and the initialization transistor TF to the off state. With this, the initialization of the gate voltage of the drive transistor Tdr is completed.

Figure 7:
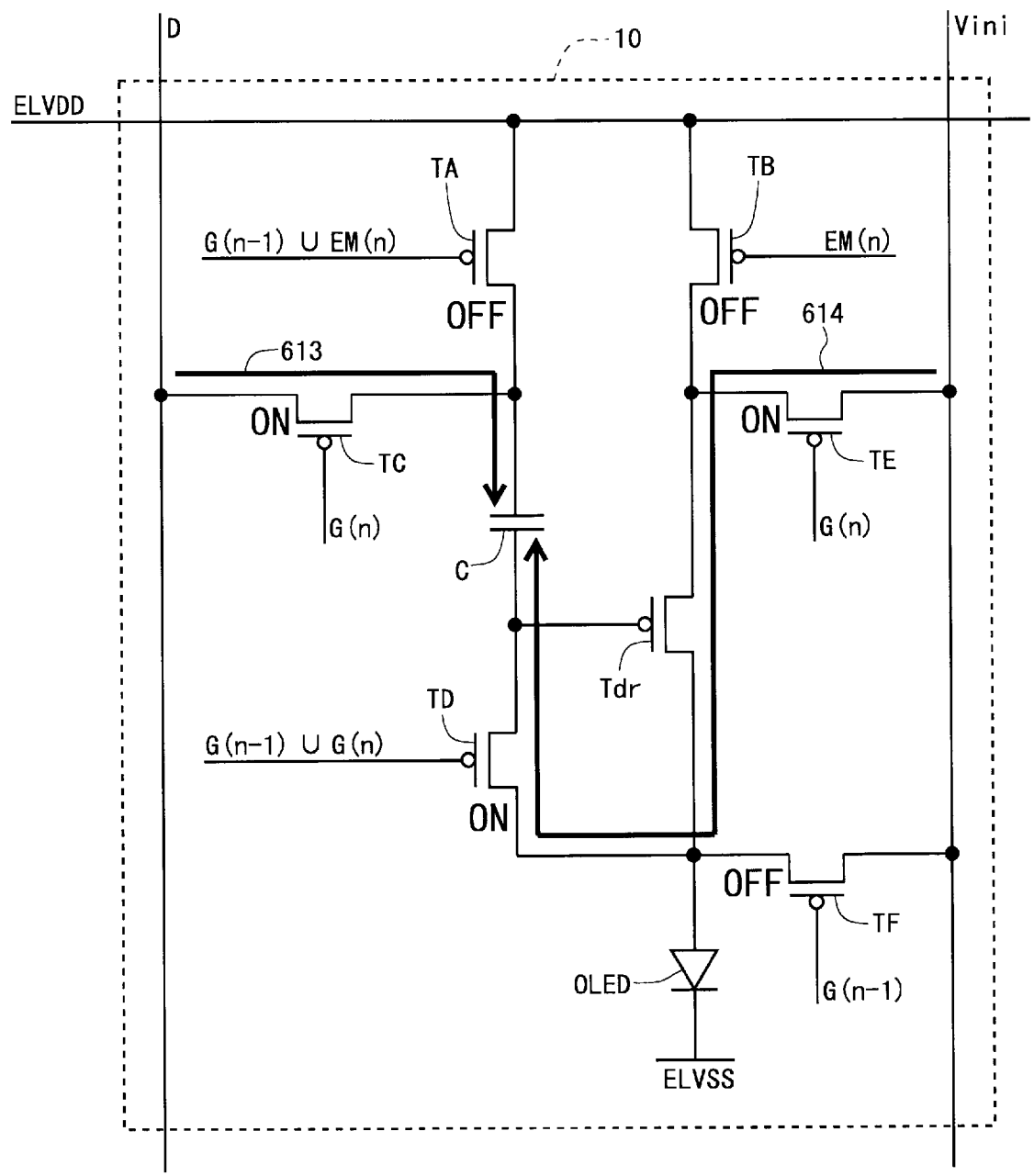
FIG. 7 is a diagram for describing actions in a data writing period in the first embodiment.

At the time t13, the scanning signal G(n) is changed from the high level to the low level. This turns the first writing control transistor TC, the threshold voltage compensation transistor TD, and the second writing control transistor TE to the on state. When the first writing control transistor TC is turned on, a data voltage (voltage of the data signal D) Vdata is applied to the second electrode of the data-holding capacitor C, as indicated by an arrow denoted by a reference sign 613 in FIG. 7. In this regard, the first writing control transistor TC is turned on in a state in which the voltage of the magnitude of "ELVDD−Vini" is held in the data-holding capacitor C as described above. Accordingly, the magnitude of a gate voltage Vg of the drive transistor Tdr is expressed by Equation (5) below.

$$Vg = Vdata - (ELVDD - Vini) \quad (5)$$
$$= (Vdata - ELVDD) + Vini$$

Here, the maximum value of the data voltage Vdata is set to a value smaller than the high-level power supply voltage ELVDD, so that "Vdata−ELVDD" takes a negative value. Accordingly, the gate voltage Vg of the drive transistor Tdr becomes smaller than the initialization voltage Vini, and a current flows between the first conduction terminal and the second conduction terminal of the drive transistor Tdr, as indicated by an arrow denoted by a reference sign 614 in FIG. 7. When a threshold voltage (absolute value) of the drive transistor Tdr is taken as Vth, a voltage of the magnitude of "Vini−Vth" is applied to the first electrode of the data-holding capacitor C. Since the data voltage Vdata is applied to the second electrode of the data-holding capacitor C, a voltage of the magnitude of "Vdata−(Vini−Vth)" is held in the data-holding capacitor C. In this manner, in the period from the time t13 to the time t14, data writing is performed (the data-holding capacitor C is charged based on the data signal D).

At the time t14, the scanning signal G(n) is changed from the low level to the high level. This turns the first writing control transistor TC, the threshold voltage compensation transistor TD, and the second writing control transistor TE to the off state. With this, the writing of the data is completed.

Figure 8:
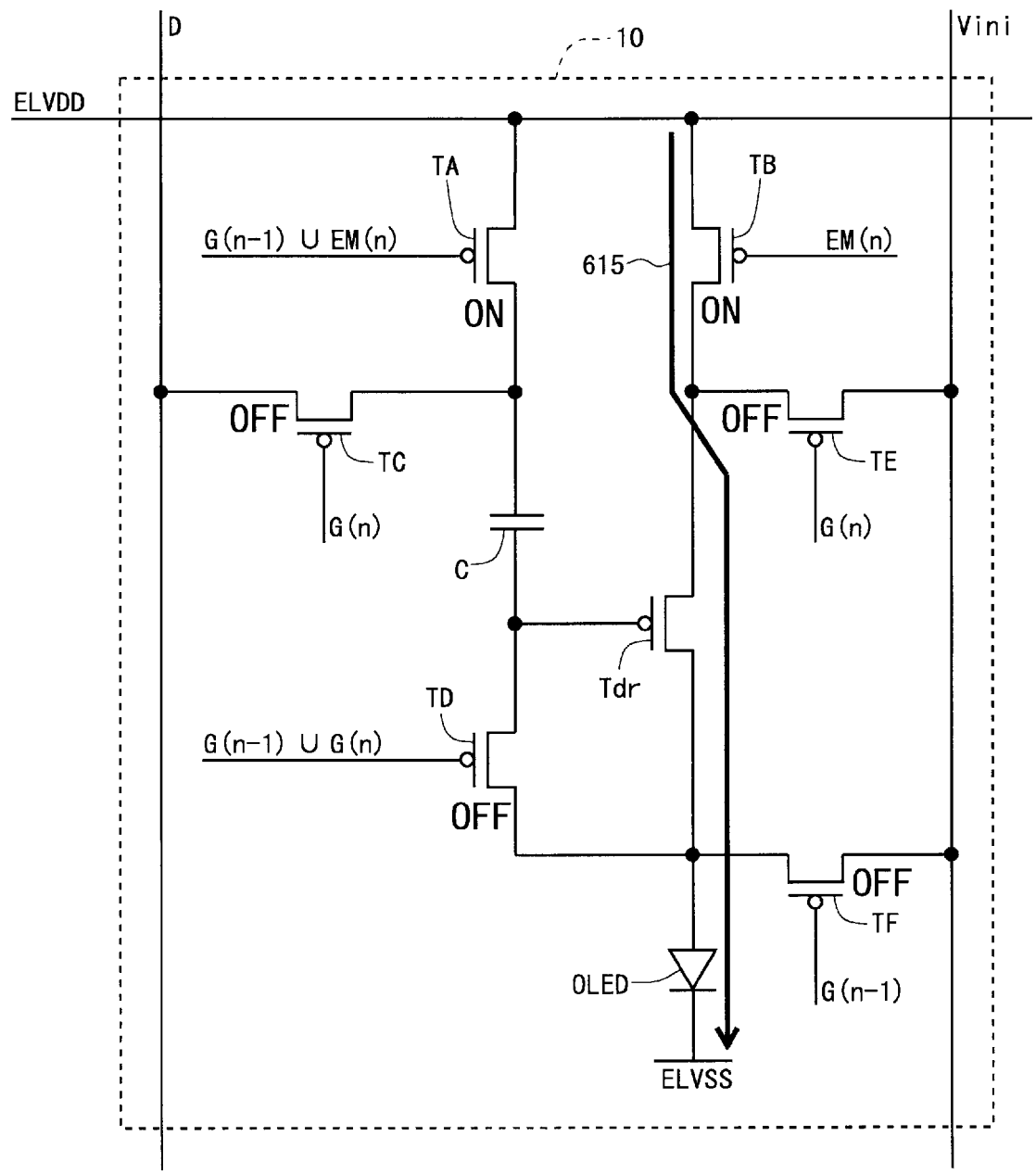
FIG. 8 is a diagram for describing actions in a light emission period in the first embodiment.

At the time t15, the light emission control signal EM(n) is changed from the high level to the low level. This turns the power supply control transistor TA and the light emission control transistor TB to the on state. As a result, a drive current of a size corresponding to the voltage between the first conduction terminal and the gate terminal of the drive transistor Tdr is supplied to the light-emitting element OLED as indicated by an arrow denoted by a reference sign 615 in FIG. 8, so that the light-emitting element OLED emits light in accordance with the size of the drive current. Then, the light-emitting element OLED emits light throughout a period until the light emission control signal EM(n) is changed from the low level to the high level at the time t10 of the next frame.

Note that, since the power supply control transistor TA is turned on at the time t15, the high-level power supply voltage ELVDD is applied to the second electrode of the data-holding capacitor C. Further, immediately before the time t15, the voltage of the magnitude of "Vdata−(Vini−Vth)" is held in the data-holding capacitor C as described above. Accordingly, during the light emission period, the magnitude of the gate voltage Vg of the drive transistor Tdr is expressed by Equation (6) below.

$$Vg = ELVDD - (Vdata - (Vini - Vth)) \quad (6)$$
$$= ELVDD - (Vdata - Vini + Vth)$$

At this time, a voltage Vgs between the first conduction terminal and the gate terminal of the drive transistor Tdr is expressed by Equation (7) below.

$$Vgs = ELVDD - Vg \quad (7)$$
$$= ELVDD - (ELVDD - (Vdata - Vini + Vth))$$
$$= Vdata - Vini + Vth$$

A drive current Ioled is determined by the above Equation (2). When the above Equation (7) is substituted in the above Equation (2), Equation (8) below is obtained.

$$Ioled = \beta/2 \cdot (Vdata - Vini)^2 \quad (8)$$

The above Equation (8) does not contain the term of the threshold voltage Vth. In other words, regardless of the magnitude of threshold voltage Vth of the drive transistor Tdr, the drive current Ioled in accordance with the magnitude of the data voltage Vdata is supplied to the light-emitting element OLED. Thus, a variation in the threshold voltage Vth of the drive transistor Tdr is compensated.

In the present embodiment, the scanning signal G(n−1) corresponds to a first control signal, the scanning signal G(n) corresponds to a second control signal, the light emission control signal EM(n) corresponds to a third control signal, the signal representing the logical sum of the scanning signal G(n−1) and the scanning signal G(n) corresponds to a fourth control signal, and the signal representing the logical sum of the scanning signal G(n−1) and the light emission control signal EM(n) corresponds to a fifth control signal. The actions performed in the period from the time t11 to the time t12 correspond to initialization processing, the actions performed in the period from the time t13 to the time t14 correspond to data writing processing, and the actions performed in the period before the time t10 and the period after the time t15 correspond to light emission processing.

1.4 Effects

According to the present embodiment, the data writing is performed by applying the data voltage Vdata to the second electrode of the data-holding capacitor C in the state of the initialization voltage Vini being applied to the first electrode of the data-holding capacitor C via the drive transistor Tdr. In this regard, in the organic EL panel, the amount of the current flowing through the initialization power source wiring line that transfers the initialization voltage Vini is significantly smaller than the amount of the current flowing through the first power source wiring line that transfers the high-level power supply voltage ELVDD (because the high-level power supply voltage ELVDD contributes to the supply of the current to cause the light-emitting element OLED to emit light). Therefore, as for the initialization voltage Vini, a variation in the magnitude of voltage is small. That is, the writing of data into the data-holding capacitor C is performed by applying the data voltage Vdata to the electrode (second electrode) opposing the electrode (first electrode) to which a substantially constant voltage is applied. This makes it possible to perform stable data writing. With this, the occurrence of a variation in luminance is prevented when the data is written based on the data voltage Vdata of the same magnitude. The size of the drive current Ioled depends on the magnitude of the threshold voltage Vth of the drive transistor Tdr, and prior to the light emission by the light-emitting element OLED, the voltage corresponding to the data voltage Vdata and the threshold voltage of the drive transistor Tdr is held in the data-holding capacitor C. As a result, when the light-emitting element OLED emits light, the influence of the threshold voltage Vth is canceled, and the drive current Ioled of the size corresponding to the data voltage Vdata is supplied to the light-emitting element OLED. That is, the variation in the threshold voltage Vth of the drive transistor Tdr is compensated. As described above, according to the present embodiment, an organic EL display device able to compensate for the variation in the threshold voltage Vth of the drive transistor Tdr is achieved without causing a variation in luminance.

2. Second Embodiment

A second embodiment will be described below. The overall configuration is similar to that of the first embodiment, and therefore the description thereof will be omitted.

2.1 Configuration of Pixel Circuit

Figure 9:
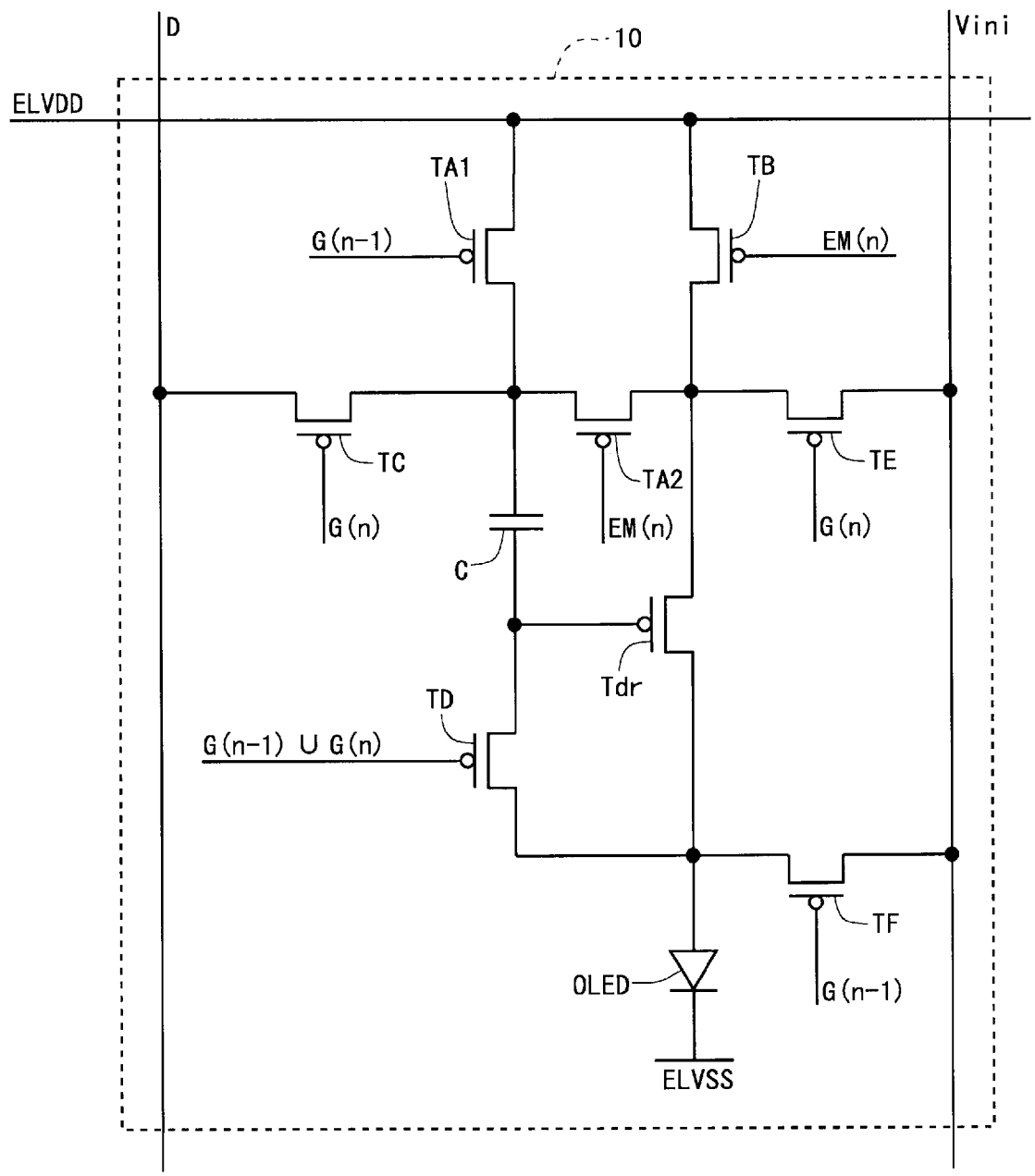
FIG. 9 is a circuit diagram illustrating a configuration of a pixel circuit in a second embodiment.

A configuration of a pixel circuit 10 in the present embodiment will be described while referring to FIG. 9. As illustrated in FIG. 9, the pixel circuit 10 includes one light-emitting element OLED, eight transistors (a drive transistor Tdr, a first power supply control transistor TA1, a second power supply control transistor TA2, a light emission control transistor TB, a first writing control transistor TC, a threshold voltage compensation transistor TD, a second writing control transistor TE, and an initialization transistor TF), and one data-holding capacitor C. Description of the same points as those in the first embodiment will be appropriately omitted, and points different from those in the first embodiment will be mainly described below.

In the first embodiment, one power supply control transistor TA is provided (see FIG. 1) to apply the high-level voltage ELVDD to the second electrode of the data-holding capacitor C during the initialization period and the light emission period. In contrast, in the present embodiment, instead of the power supply control transistor TA in the first embodiment, the first power supply control transistor TA1 and the second power supply control transistor TA2 are provided as illustrated in FIG. 9. As for the first power supply control transistor TA1, the gate terminal is connected to a scanning signal line GL(n−1), the first conduction terminal is connected to a first power source wiring line, and the second conduction terminal is connected to the second electrode of the data-holding capacitor C, the second conduction terminal of the first writing control transistor TC, and the second conduction terminal of the second power supply control transistor TA2. As for the second power supply control transistor TA2, the gate terminal is connected to a light emission control line EML(n), the first conduction terminal is connected to the first conduction terminal of the drive transistor Tdr, the second conduction terminal of the light emission control transistor TB and the second conduction terminal of the second writing control transistor TE, and the second conduction terminal is connected to the second electrode of the data-holding capacitor C, the second conduction terminal of the first power supply control transistor TA1, and the second conduction terminal of the first writing control transistor TC.

In the present embodiment, a light emitting controller is implemented by the light emission control transistor TB, a power supply controller is implemented by the first power supply control transistor TA1 and the second power supply control transistor TA2, and a threshold voltage compensator is implemented by the threshold voltage compensation transistor TD.

It is preferable that the first power supply control transistor TA1, the second power supply control transistor TA2, the light emission control transistor TB, the first writing control transistor TC, and the second writing control transistor TE employ a TFT of a double gate structure so as to reduce an off-leak current.

2.2 Driving Method

Figure 10:
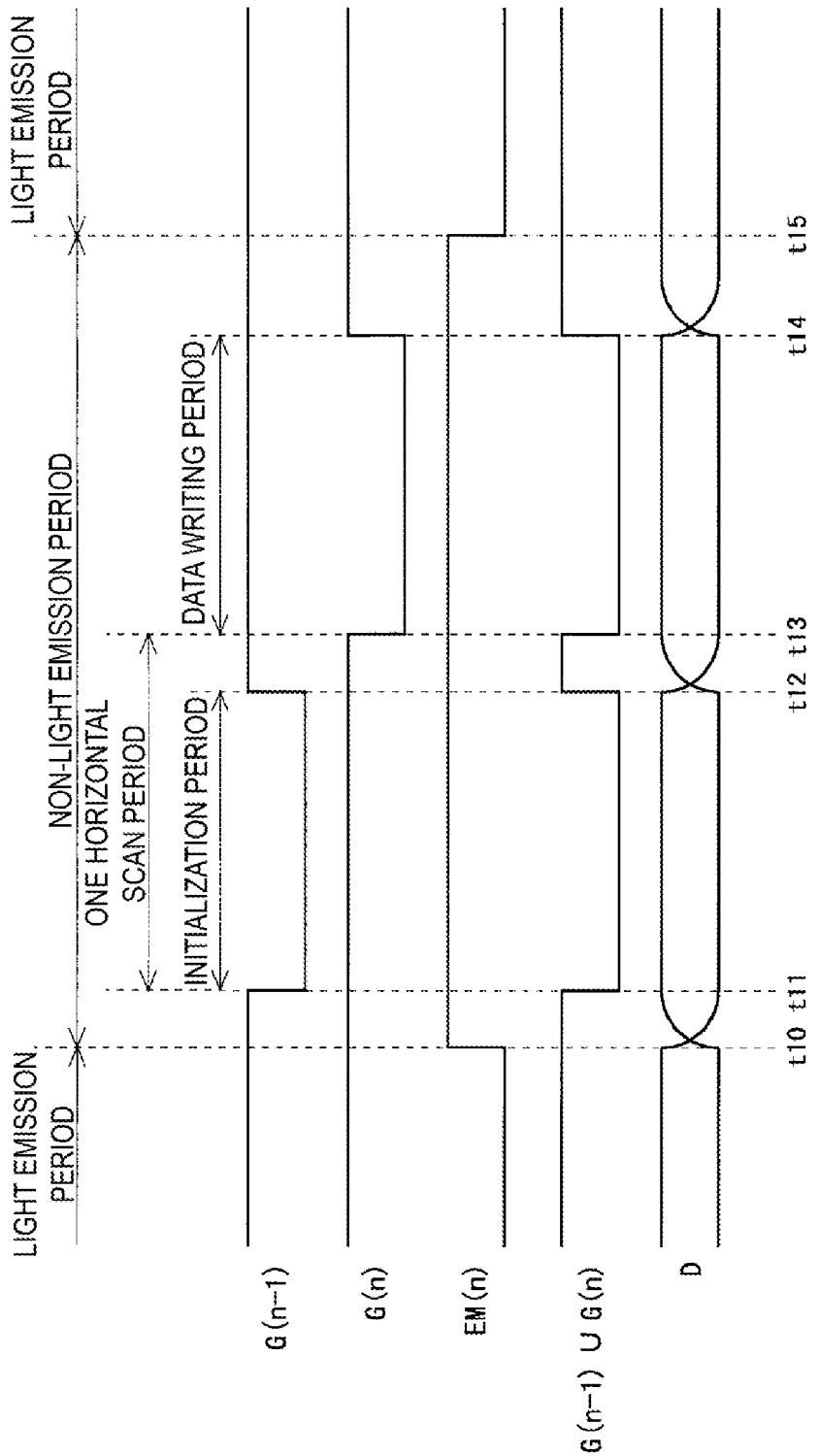
FIG. 10 is a timing chart for describing a driving method for a pixel circuit in the second embodiment.

Next, a driving method will be described. FIG. 10 is a timing chart for describing a driving method for the pixel circuit (the pixel circuit illustrated in FIG. 9) 10 located in the n-th row. For ease of comparison with the first embodiment, the same reference signs as those in FIG. 5 are used for the reference signs representing time (the same applies to FIG. 16 and FIG. 21).

In the period before the time t10, a scanning signal G(n−1) and a scanning signal G(n) are at a high level, and a light emission control signal EM(n) is at a low level. At this time, the light emission control transistor TB and the second power supply control transistor TA2 are in an on state, while the first power supply control transistor TA1, the first writing control transistor TC, the threshold voltage compensation transistor TD, the second writing control transistor TE, and the initialization transistor TF are in an off state. As a result, a drive current of a size corresponding to the voltage between the first conduction terminal and the gate terminal of the drive transistor Tdr is supplied to the light-emitting element OLED, so that the light-emitting element OLED emits light.

At the time t10, the light emission control signal EM(n) is changed from the low level to the high level. This turns the light emission control transistor TB and the second power supply control transistor TA2 to the off state. As a result, the supply of the current to the light-emitting element OLED is blocked, so that the light-emitting element OLED is turned to the non-emitting (switch-off) state.

Figure 11:
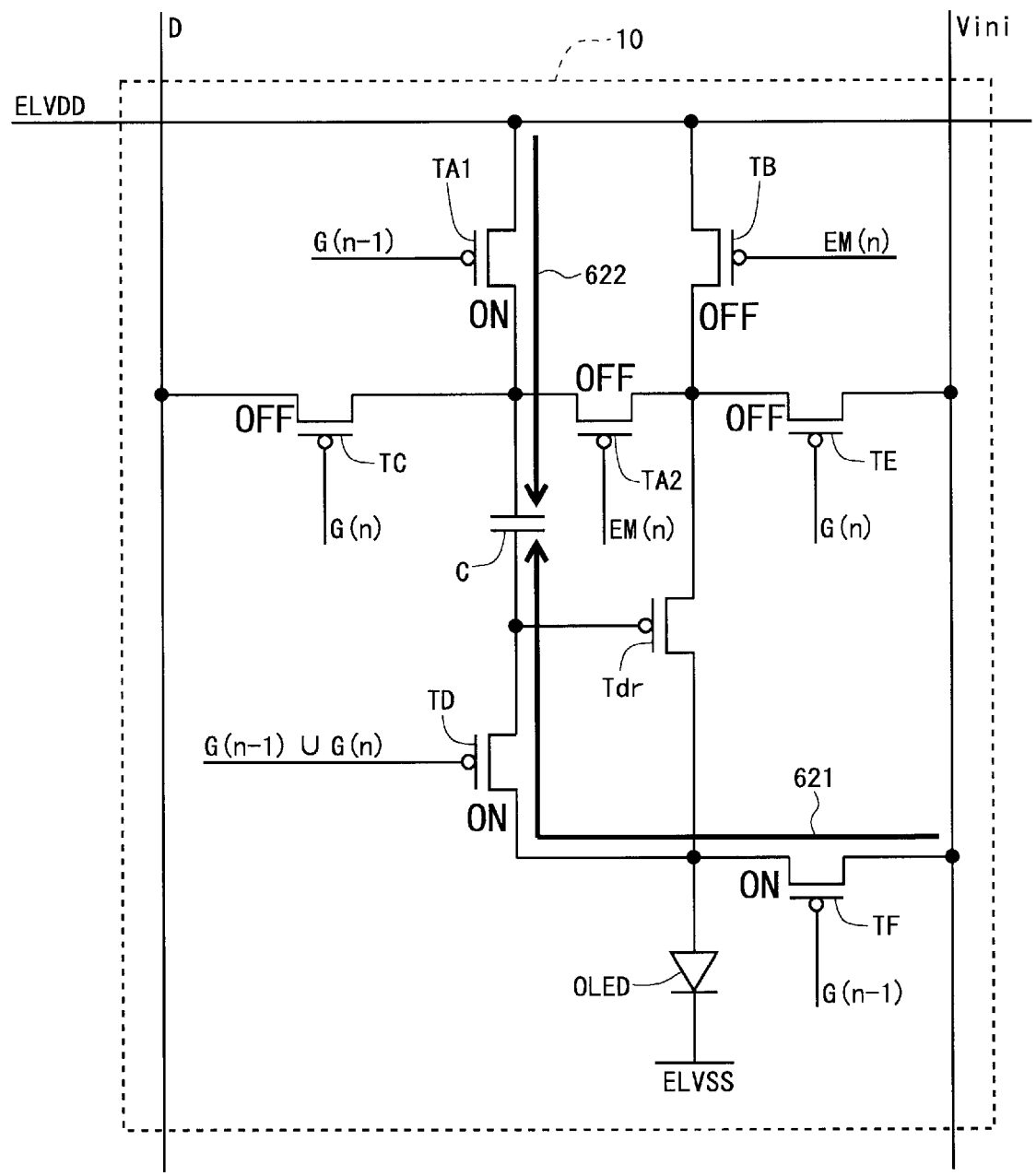
FIG. 11 is a diagram for describing actions in an initialization period in the second embodiment.

At the time t11, the scanning signal G(n−1) is changed from the high level to the low level. As a result, similarly to the first embodiment, an initialization voltage Vini is applied to a first electrode of the data-holding capacitor C (see an arrow denoted by a reference sign 621 in FIG. 11), and a high-level power supply voltage ELVDD is applied to the second electrode of the data-holding capacitor C (see an arrow denoted by a reference sign 622 in FIG. 11). As a result, a voltage of the magnitude of "ELVDD−Vini" is held in the data-holding capacitor C. At the time t12, the scanning signal G(n−1) is changed from the low level to the high level. With this, similarly to the first embodiment, the initialization of the gate voltage of the drive transistor Tdr is completed.

Figure 12:
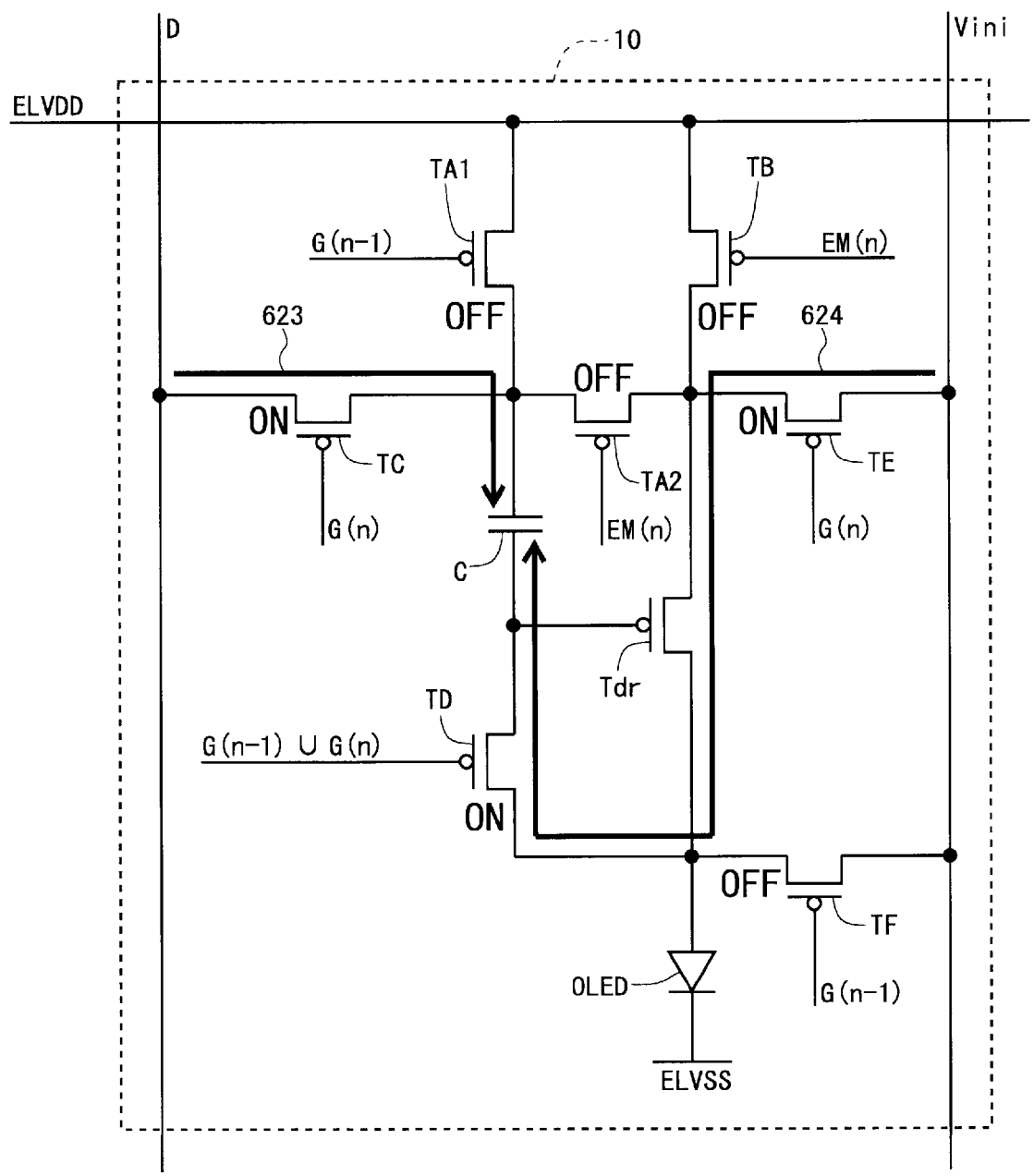
FIG. 12 is a diagram for describing actions in a data writing period in the second embodiment.

At the time t13, the scanning signal G(n) is changed from the high level to the low level. With this, similarly to the first embodiment, a data voltage Vdata is applied to the second electrode of the data-holding capacitor C (see an arrow denoted by a reference sign 623 in FIG. 12), and a voltage of the magnitude of "Vini−Vth" is applied to the first electrode of the data-holding capacitor C (see an arrow denoted by a reference sign 624 in FIG. 12). As a result, a voltage of the magnitude of "Vdata−(Vini−Vth)" is held in the data-holding capacitor C. At the time t14, the scanning signal G(n) is changed from the low level to the high level. With this, similarly to the first embodiment, the writing of the data is completed.

Figure 13:
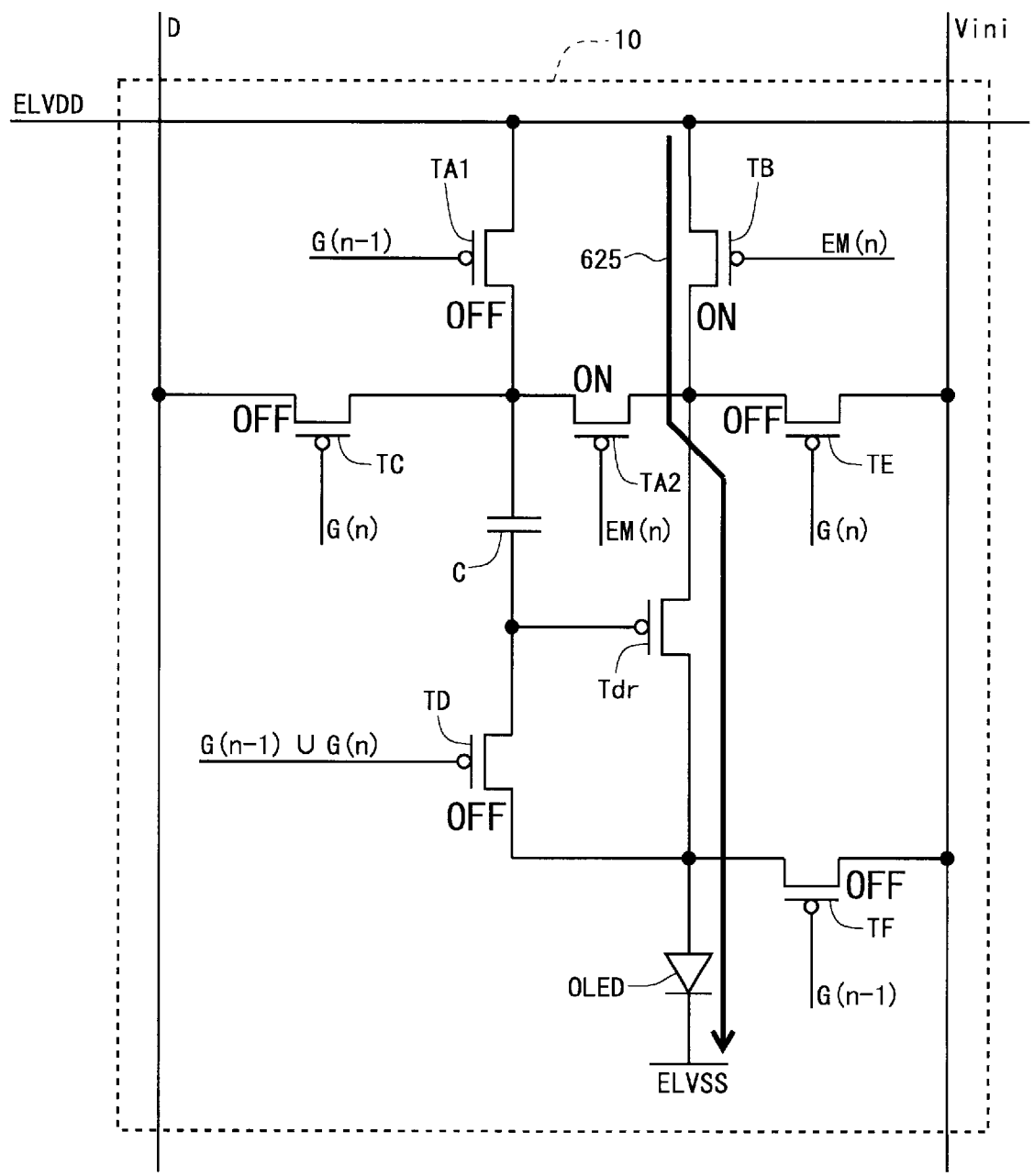
FIG. 13 is a diagram for describing actions in a light emission period in the second embodiment.

At the time t15, the light emission control signal EM(n) is changed from the high level to the low level. This turns the light emission control transistor TB and the second power supply control transistor TA2 to the on state. At this time, in the first embodiment, the high-level power supply voltage ELVDD is supplied to the second electrode of the data-holding capacitor C via the power supply control transistor TA (see FIG. 1); however, in the present embodiment, the high-level power supply voltage ELVDD is supplied to the second electrode of the data-holding capacitor C via the light emission control transistor TB and the second power supply control transistor TA2. As a result, the same actions as those of the first embodiment are performed. That is, a drive current of a size corresponding to the voltage between the first conduction terminal and the gate terminal of the drive transistor Tdr is supplied to the light-emitting element OLED as indicated by an arrow denoted by a reference sign 625 in FIG. 13, so that the light-emitting element OLED emits light in accordance with the size of the drive current. A gate voltage Vg of the drive transistor Tdr, a voltage Vgs between the first conduction terminal and the gate terminal of the drive transistor Tdr, and a drive current Ioled during the light emission period are similar to those in the first embodiment. Thus, as in the first embodiment, a variation in the threshold voltage Vth of the drive transistor Tdr is compensated.

2.3 Effects

In the present embodiment as well, the writing of data into the data-holding capacitor C is performed by applying the data voltage Vdata to the electrode (second electrode) opposing the electrode (first electrode) to which a substantially constant voltage is applied. With this, it is possible to perform stable data writing, so that the occurrence of a variation in luminance is prevented when the data is written based on the data voltage Vdata of the same magnitude. In the present embodiment as well, prior to the light emission by the light-emitting element OLED, the voltage corresponding to the data voltage Vdata and the threshold voltage of the drive transistor Tdr is held in the data-holding capacitor C. Accordingly, when the light-emitting element OLED emits light, a variation in the threshold voltage Vth of the drive transistor Tdr is compensated. As described above, similarly to the first embodiment, an organic EL display device able to compensate for the variation in the threshold voltage Vth of the drive transistor Tdr is achieved without causing a variation in luminance.

Further, in the present embodiment, unlike the first embodiment, a signal (synthetic signal) representing a logical sum of the scanning signal G(n−1) and the light emission control signal EM(n) is not required to be supplied into the pixel circuit 10. Because of this, the above-discussed first logical-sum signal wiring line (i first logical-sum signal wiring lines in the entirety of a display portion 100) is unnecessary. Accordingly, it is possible to reduce the number of control lines required to operate the pixel circuit 10 in comparison with the first embodiment.

2.4 Modification Example

Figure 14:
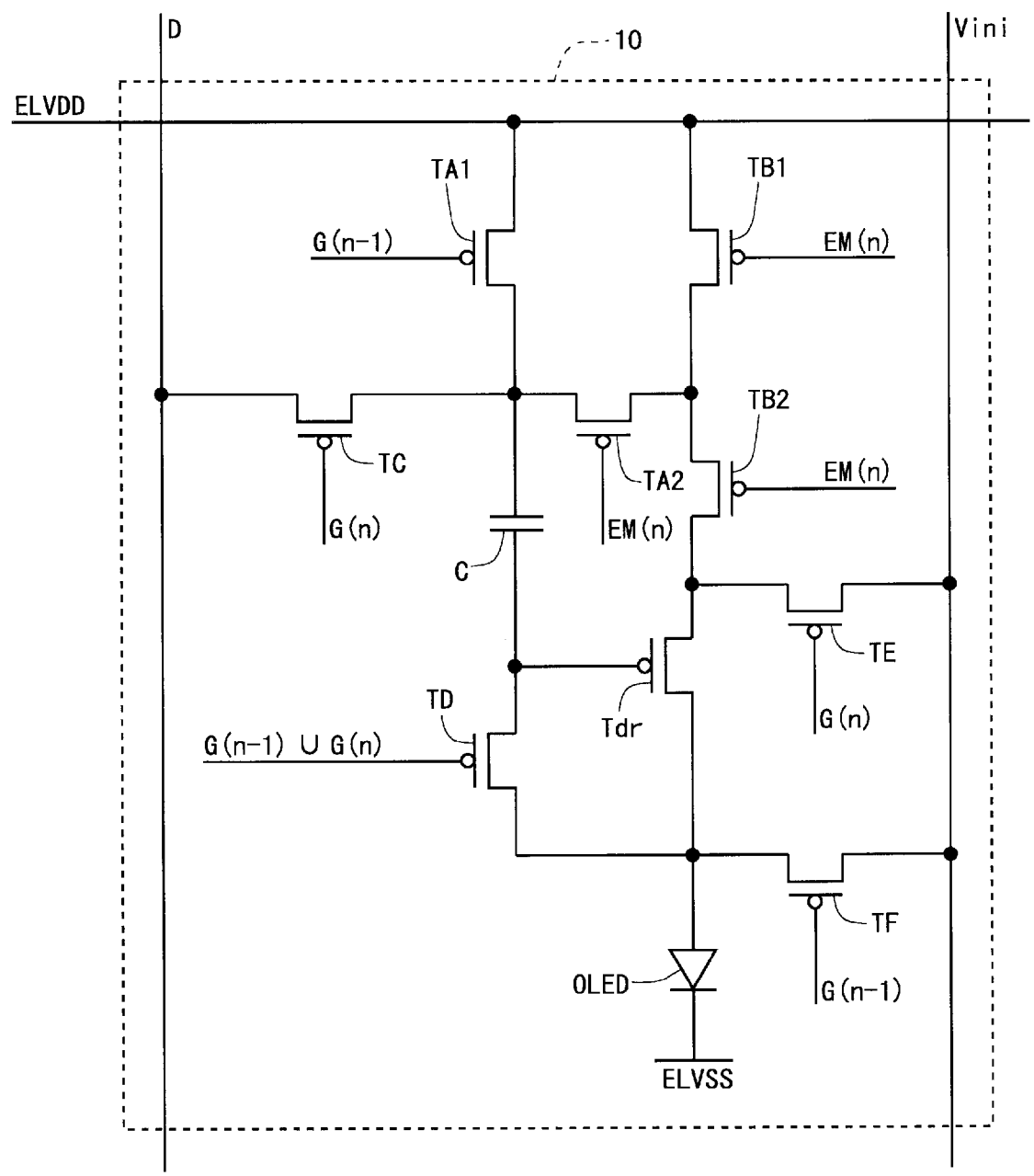
FIG. 14 is a circuit diagram illustrating a configuration of a pixel circuit in a modification example of the second embodiment.

FIG. 14 is a circuit diagram illustrating a configuration of a pixel circuit 10 in a modification example of the second embodiment. In the present modification example, instead of one light emission control transistor TB in the second embodiment, a first light emission control transistor TB1 and a second light emission control transistor TB2 are provided as illustrated in FIG. 14. As for the first light emission control transistor TB1, the gate terminal is connected to a light emission control line EML(n), the first conduction terminal is connected to a first power source wiring line, and the second conduction terminal is connected to the first conduction terminal of the second light emission control transistor TB2 and the first conduction terminal of a second power supply control transistor TA2. As for the second light emission control transistor TB2, the gate terminal is connected to the light emission control line EML(n), the first conduction terminal is connected to the second conduction terminal of the first light emission control transistor TB1 and the first conduction terminal of the second power supply control transistor TA2, and the second conduction terminal is connected to the first conduction terminal of a drive transistor Tdr and the second conduction terminal of a second writing control transistor TE. In the present modification example, a light emitting controller is achieved by the first light emission control transistor TB1 and the second light emission control transistor TB2. Since the driving method is similar to that of the second embodiment, description thereof will be omitted (see FIG. 10).

In the configuration of the second embodiment (see FIG. 9), it is preferable to employ a TFT of a double gate structure for the light emission control transistor TB and the second power supply control transistor TA2. However, according to the configuration of the present modification example, even when a TFT of a single gate structure is employed for three TFTs (the first light emission control transistor TB1, the second light emission control transistor TB2, and the second power supply control transistor TA2), it is possible to sufficiently reduce the off-leak current. This makes it possible to reduce the total number of TFTs in the pixel circuit 10.

3. Third Embodiment

A third embodiment will be described below. The overall configuration is similar to that of the first embodiment, and therefore the description thereof will be omitted.

3.1 Configuration of Pixel Circuit

Figure 15:
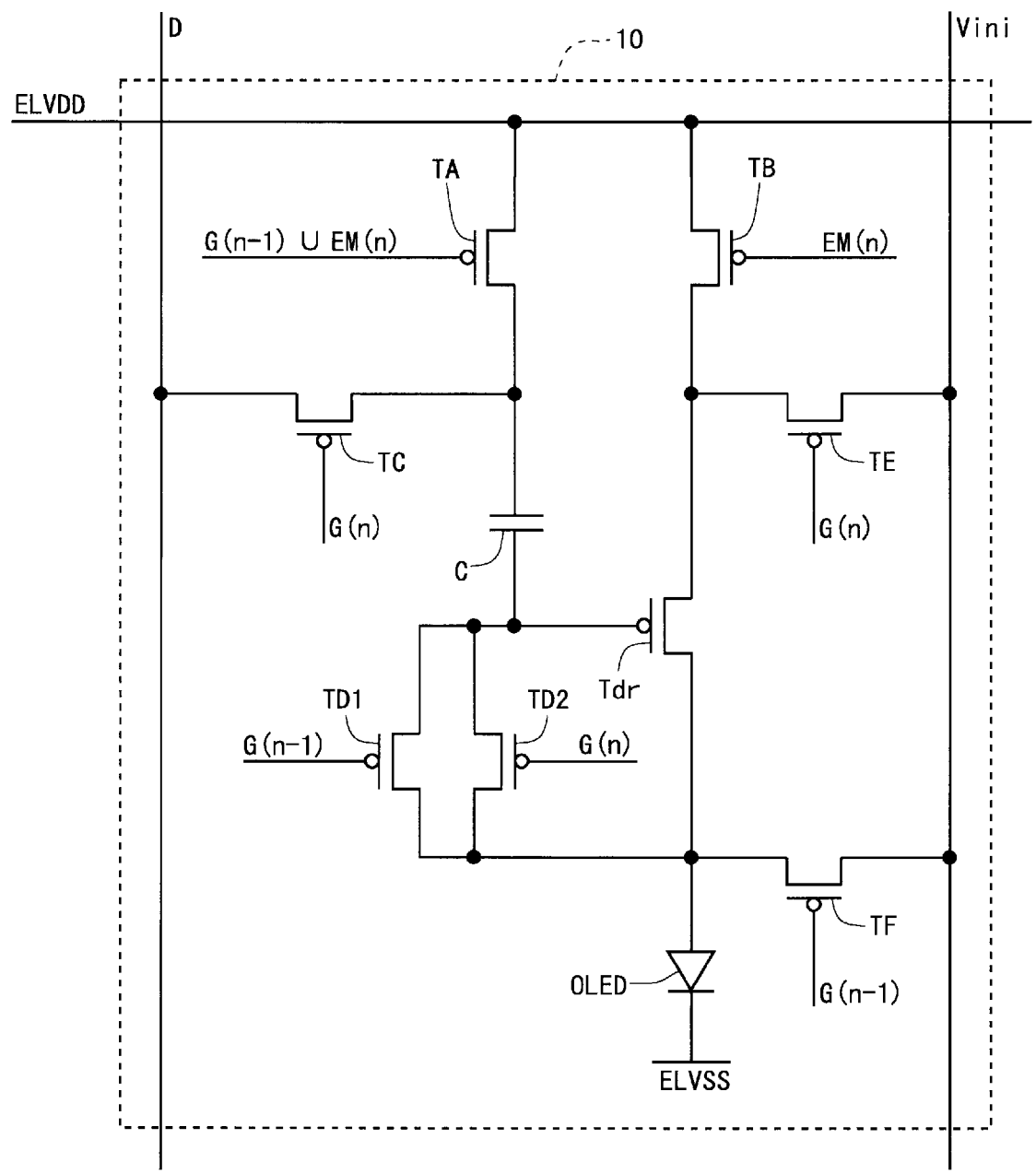
FIG. 15 is a circuit diagram illustrating a configuration of a pixel circuit in a third embodiment.

A configuration of a pixel circuit 10 in the present embodiment will be described while referring to FIG. 15. As illustrated in FIG. 15, the pixel circuit 10 includes one light-emitting element OLED, eight transistors (a drive transistor Tdr, a power supply control transistor TA, a light emission control transistor TB, a first writing control transistor TC, a first threshold voltage compensation transistor TD1, a second threshold voltage compensation transistor TD2, a second writing control transistor TE, and an initialization transistor TF), and one data-holding capacitor C.

In the first embodiment, one threshold voltage compensation transistor TD is provided (see FIG. 1) to electrically connect the gate terminal and the second conduction terminal of the drive transistor Tdr during the initialization period and the data writing period. In contrast, in the present embodiment, instead of the threshold voltage compensation transistor TD in the first embodiment, the first threshold voltage compensation transistor TD1 and the second threshold voltage compensation transistor TD2 are provided as illustrated in FIG. 15.

As for the first threshold voltage compensation transistor TD1, the gate terminal is connected to a scanning signal line GL(n−1), the first conduction terminal is connected to the second conduction terminal of the drive transistor Tdr, the first conduction terminal of the initialization transistor TF, the first conduction terminal of the second threshold voltage compensation transistor TD2 and an anode terminal of the light-emitting element OLED, and the second conduction terminal is connected to the gate terminal of the drive transistor Tdr, the second conduction terminal of the second threshold voltage compensation transistor TD2, and a first electrode of the data-holding capacitor C. As for the second threshold voltage compensation transistor TD2, the gate terminal is connected to a scanning signal line GL(n), the first conduction terminal is connected to the second conduction terminal of the drive transistor Tdr, the first conduction terminal of the initialization transistor TF, the first conduction terminal of the first threshold voltage compensation transistor TD1 and the anode terminal of the light-emitting element OLED, and the second conduction terminal is connected to the gate terminal of the drive transistor Tdr, the second conduction terminal of the first threshold voltage compensation transistor TD1, and the first electrode of the data-holding capacitor C. As described above, the first threshold voltage compensation transistor TD1 and the second threshold voltage compensation transistor TD2 are connected in parallel between the gate terminal and the second conduction terminal of the drive transistor Tdr.

In the present embodiment, a light emitting controller is implemented by the light emission control transistor TB, a power supply controller is implemented by the power supply control transistor TA, and a threshold voltage compensator is implemented by the first threshold voltage compensation transistor TD1 and the second threshold voltage compensation transistor TD2.

3.2 Driving Method

Figure 16:
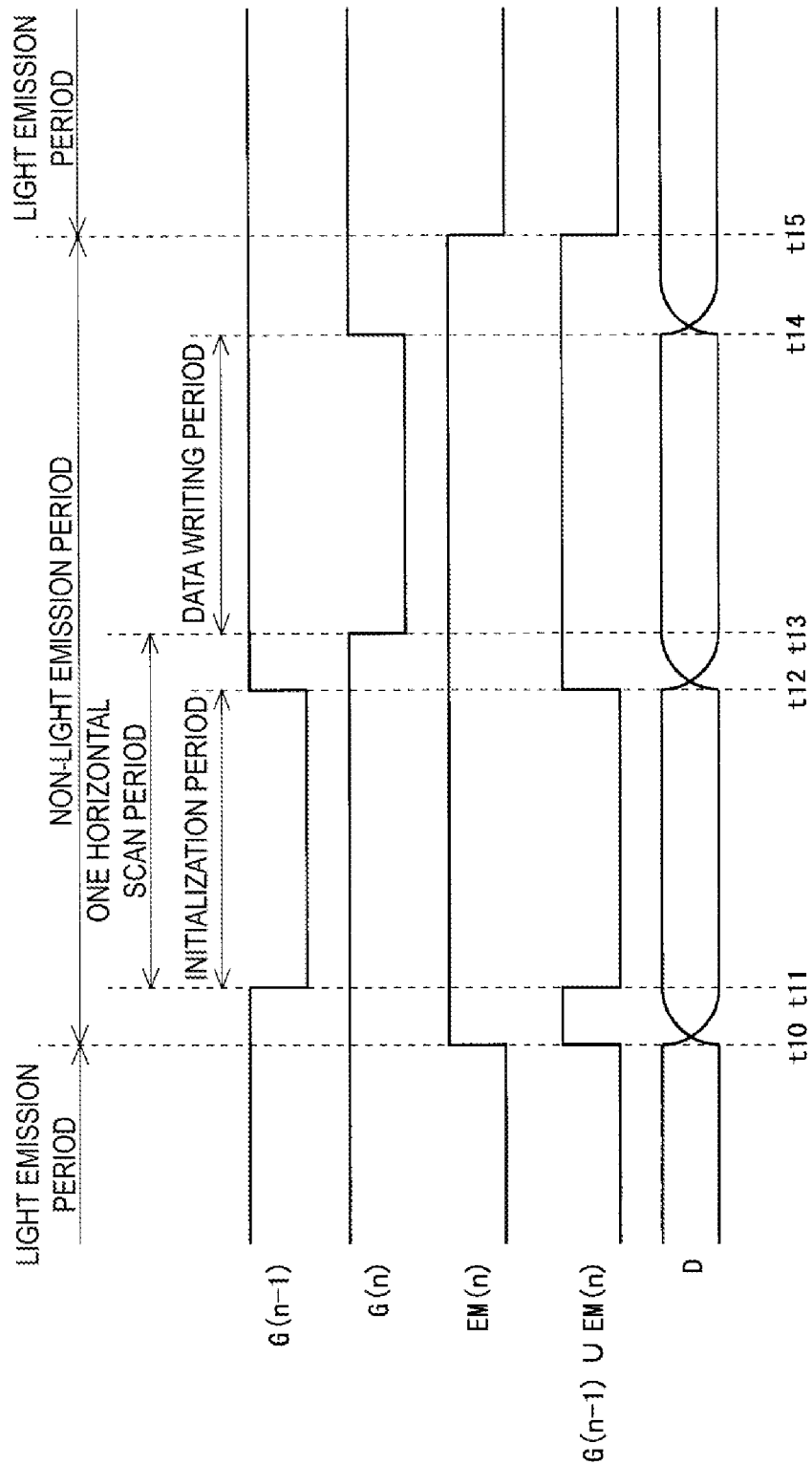
FIG. 16 is a timing chart for describing a driving method for a pixel circuit in the third embodiment.

Next, a driving method will be described. FIG. 16 is a timing chart for describing a driving method for the pixel circuit (the pixel circuit illustrated in FIG. 15) 10 located in the n-th row.

In the period before the time t10, the scanning signal G(n−1) and the scanning signal G(n) are at a high level, and a light emission control signal EM(n) is at a low level. At this time, the power supply control transistor TA and the light emission control transistor TB are in an on state. Accordingly, similarly to the first embodiment, a drive current of a size corresponding to the voltage between the first conduction terminal and the gate terminal of the drive transistor Tdr is supplied to the light-emitting element OLED, so that the light-emitting element OLED emits light.

At the time t10, the light emission control signal EM(n) is changed from the low level to the high level. With this, as in the first embodiment, the supply of the current to the light-emitting element OLED is blocked, so that the light-emitting element OLED is turned to the non-emitting (switch-off) state.

Figure 17:
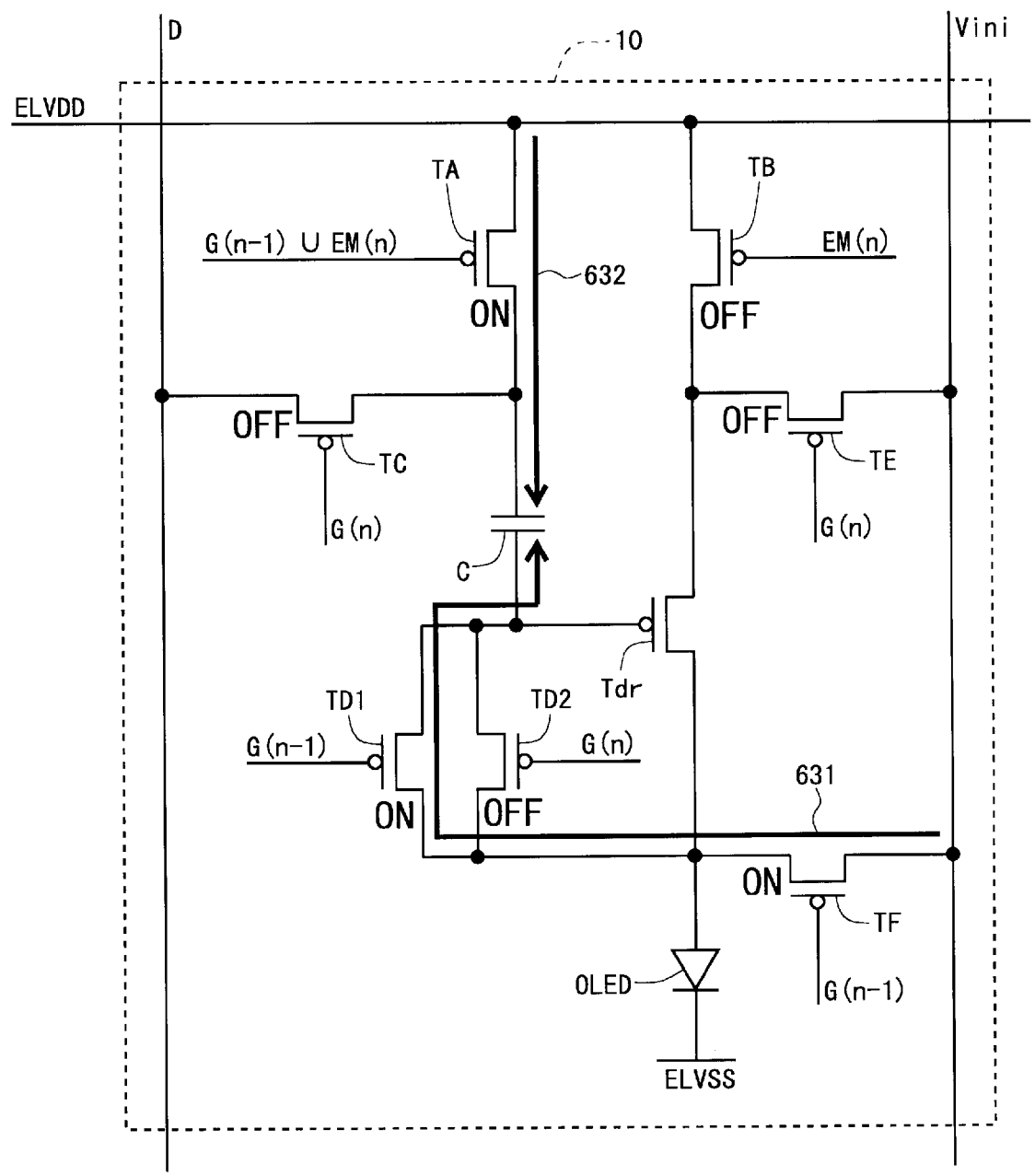
FIG. 17 is a diagram for describing actions in an initialization period in the third embodiment.

At the time t11, the scanning signal G(n−1) is changed from the high level to the low level. This turns the power supply control transistor TA, the first threshold voltage compensation transistor TD1, and the initialization transistor TF to the on state. By turning on the first threshold voltage compensation transistor TD1 and the initialization transistor TF, an initialization voltage Vini is applied to the first electrode of the data-holding capacitor C via the first threshold voltage compensation transistor TD1, as indicated by an arrow denoted by a reference sign 631 in FIG. 17. Similarly to the first embodiment, a high-level power supply voltage ELVDD is applied to a second electrode of the data-holding capacitor C (see an arrow denoted by a reference sign 632 in FIG. 17). As a result, a voltage of the magnitude of "ELVDD−Vini" is held in the data-holding capacitor C.

At the time t12, the scanning signal G(n−1) is changed from the low level to the high level. This turns the power supply control transistor TA, the first threshold voltage compensation transistor TD1, and the initialization transistor TF to an off state, and the initialization of the gate voltage of the drive transistor Tdr is completed.

Figure 18:
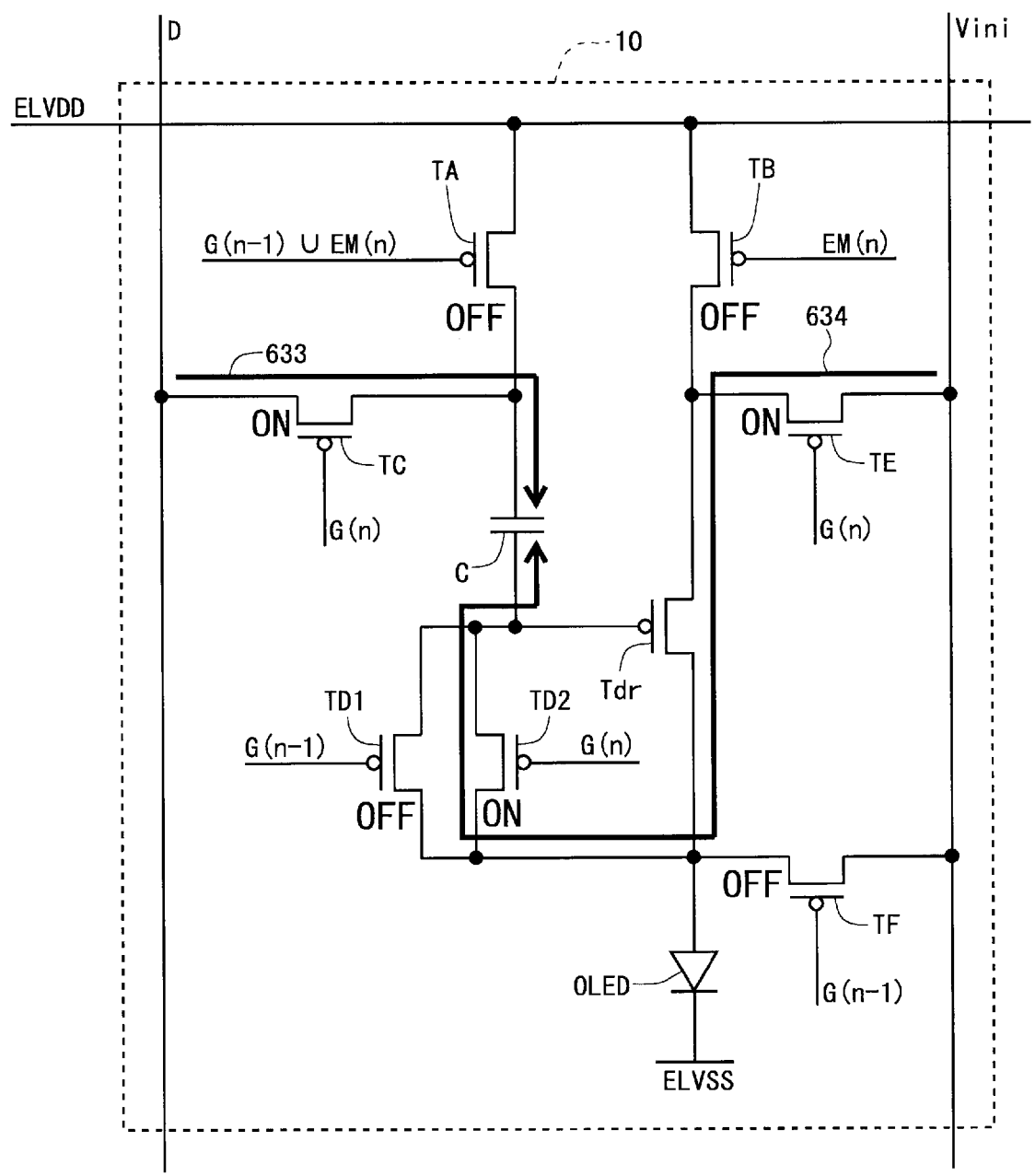
FIG. 18 is a diagram for describing actions in a data writing period in the third embodiment.

At the time t13, the scanning signal G(n) is changed from the high level to the low level. This turns the first writing control transistor TC, the second threshold voltage compensation transistor TD2, and the second writing control transistor TE to the on state. When the first writing control transistor TC is turned on, a data voltage Vdata is applied to the second electrode of the data-holding capacitor C (see an arrow denoted by a reference sign 633 in FIG. 18), similarly to the first embodiment. By turning on the second threshold voltage compensation transistor TD2 and the second writing control transistor TE, a voltage of the magnitude of "Vini−Vth" is applied to the first electrode of the data-holding capacitor C via the second threshold voltage compensation transistor TD2, as indicated by an arrow denoted by a reference sign 634 in FIG. 18. As a result, a voltage of the magnitude of "Vdata−(Vini−Vth)" is held in the data-holding capacitor C.

At the time t14, the scanning signal G(n) is changed from the low level to the high level. This turns the first writing control transistor TC, the second threshold voltage compensation transistor TD2, and the second writing control transistor TE to the off state, and the writing of the data is completed.

Figure 19:
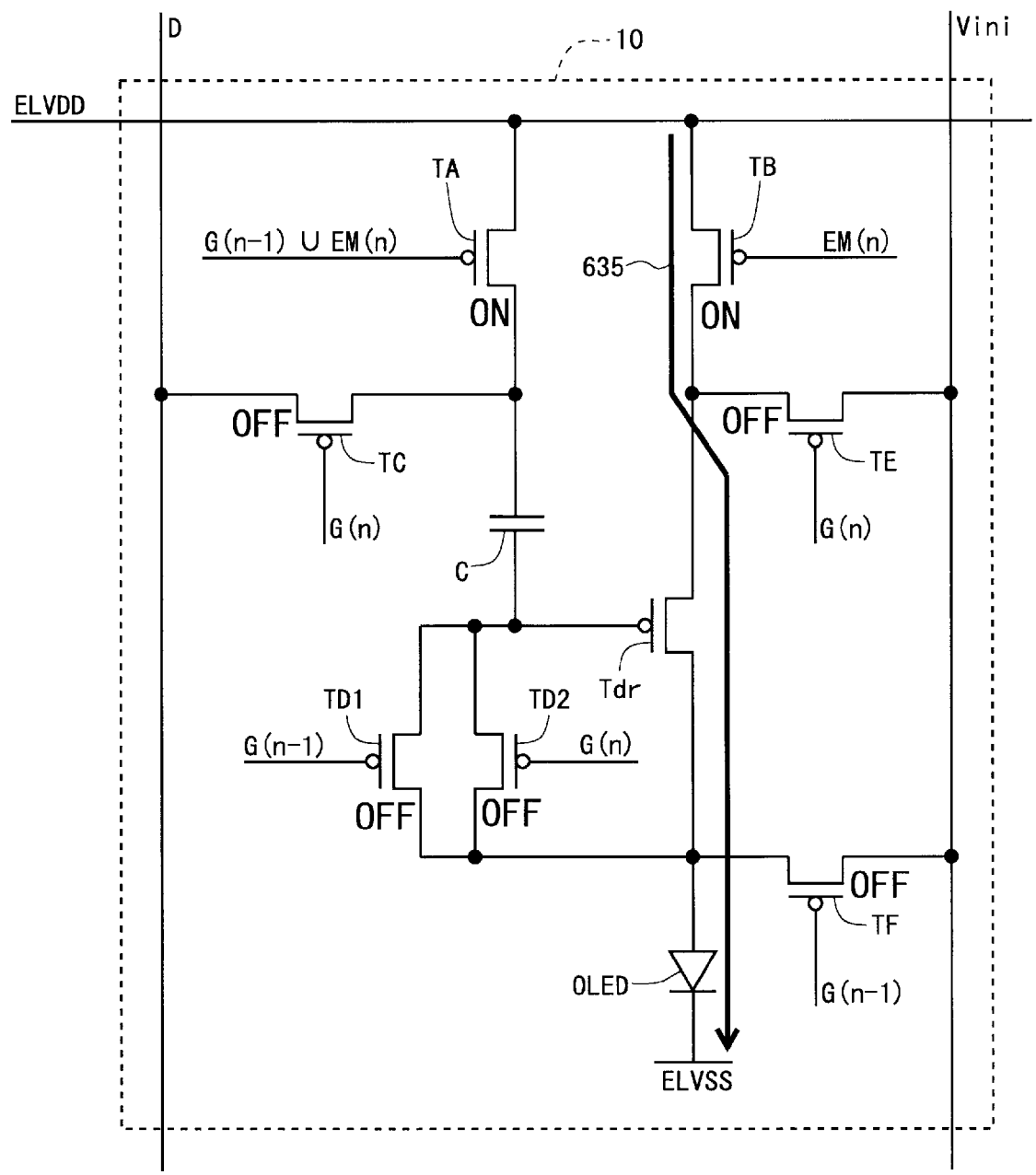
FIG. 19 is a diagram for describing actions in a light emission period in the third embodiment.

At the time t15, the light emission control signal EM(n) is changed from the high level to the low level. This turns the power supply control transistor TA and the light emission control transistor TB to the on state. As a result, similarly to the first embodiment, a drive current of a size corresponding to the voltage between the first conduction terminal and the gate terminal of the drive transistor Tdr is supplied to the light-emitting element OLED as indicated by an arrow denoted by a reference sign 635 in FIG. 19, so that the light-emitting element OLED emits light in accordance with the size of the drive current. A gate voltage Vg of the drive transistor Tdr, a voltage Vgs between the first conduction terminal and the gate terminal of the drive transistor Tdr, and a drive current Ioled during the light emission period are similar to those in the first embodiment. Thus, as in the first embodiment, a variation in the threshold voltage Vth of the drive transistor Tdr is compensated.

3.3 Effects

As in the first embodiment, also in the present embodiment, an organic EL display device able to compensate for the variation in the threshold voltage Vth of the drive transistor Tdr is achieved without causing a variation in luminance. Further, in the present embodiment, unlike the first embodiment, a signal (synthetic signal) representing a logical sum of the scanning signal G(n−1) and the scanning signal G(n) is not required to be supplied into the pixel circuit 10. Because of this, the above-discussed second logical-sum signal wiring line (i second logical-sum signal wiring lines in the entirety of a display portion 100) is unnecessary. Accordingly, it is possible to reduce the number of control lines required to operate the pixel circuit 10 in comparison with the first embodiment.

4. Fourth Embodiment

A fourth embodiment will be described below. In the present embodiment, such a configuration is adopted for the configuration of a pixel circuit 10 that the configuration of the modification example of the second embodiment (see FIG. 14) is combined with the configuration of the third embodiment (see FIG. 15). The overall configuration is similar to that of the first embodiment, and therefore the description thereof will be omitted.

4.1 Configuration of Pixel Circuit

Figure 20:
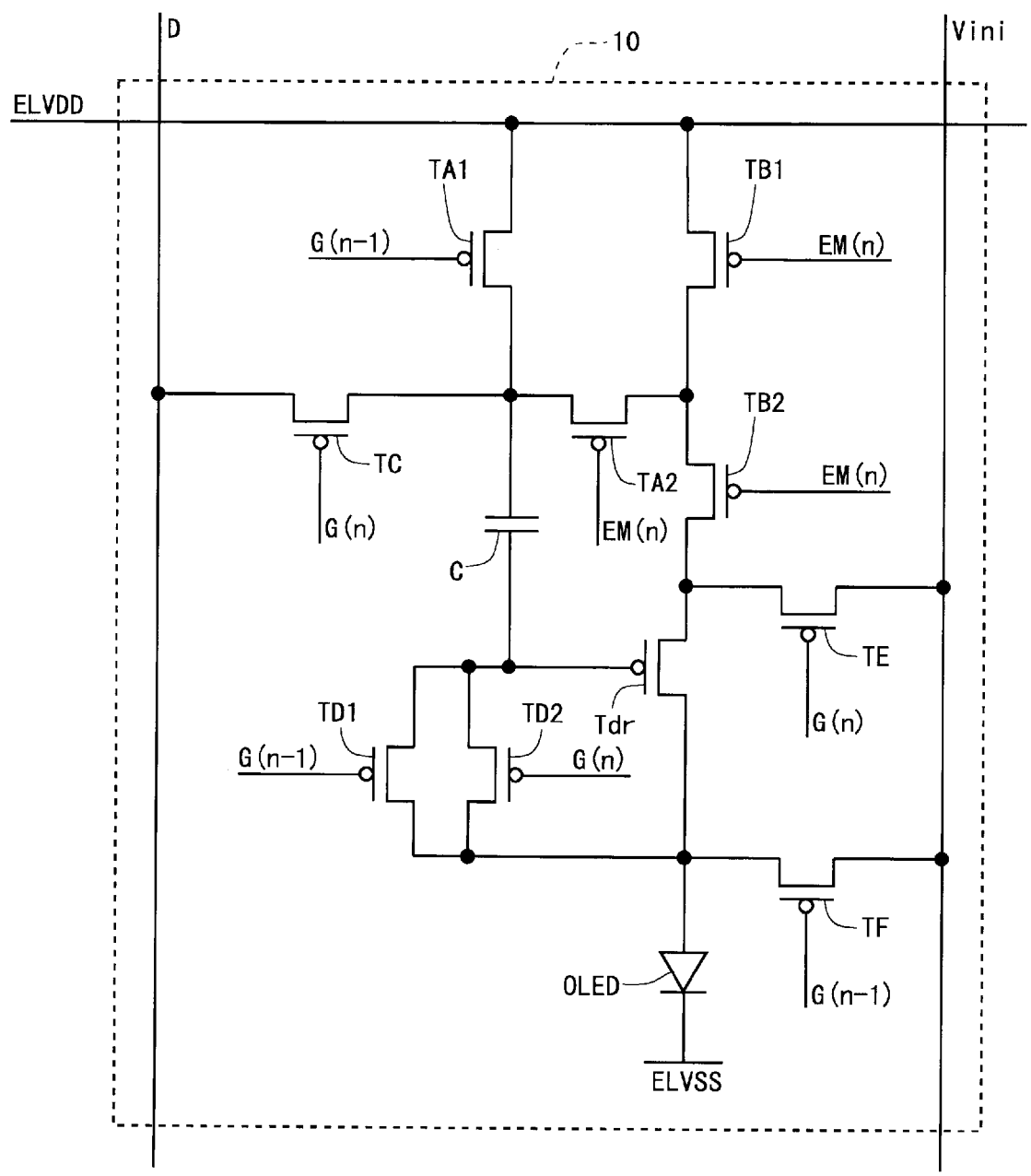
FIG. 20 is a circuit diagram illustrating a configuration of a pixel circuit in a fourth embodiment.

The configuration of the pixel circuit 10 in the present embodiment will be described while referring to FIG. 20. As illustrated in FIG. 20, the pixel circuit 10 includes one light-emitting element OLED, ten transistors (a drive transistor Tdr, a first power supply control transistor TA1, a second power supply control transistor TA2, a first light emission control transistor TB1, a second light emission control transistor TB2, a first writing control transistor TC, a first threshold voltage compensation transistor TD1, a second threshold voltage compensation transistor TD2, a second writing control transistor TE, and an initialization transistor TF), and one data-holding capacitor C.

As can be understood from FIG. 20, instead of the power supply control transistor TA in the first embodiment, the first power supply control transistor TA1 and the second power supply control transistor TA2 are provided as in the modification example of the second embodiment. Further, as in the modification example of the second embodiment, the first light emission control transistor TB1 and the second light emission control transistor TB2 are provided instead of the light emission control transistor TB in the first embodiment. Similarly to the third embodiment, the first threshold voltage compensation transistor TD1 and the second threshold voltage compensation transistor TD2 are provided instead of the threshold voltage compensation transistor TD in the first embodiment.

In the present embodiment, a light emitting controller is implemented by the first light emission control transistor TB1 and the second light emission control transistor TB2, a power supply controller is implemented by the first power supply control transistor TA1 and the second power supply control transistor TA2, and a threshold voltage compensator is implemented by the first threshold voltage compensation transistor TD1 and the second threshold voltage compensation transistor TD2.

In the present embodiment, it is preferable that the first writing control transistor TC and the second writing control transistor TE employ a TFT of a double gate structure so as to reduce the off-leak current.

4.2 Driving Method

Figure 21:
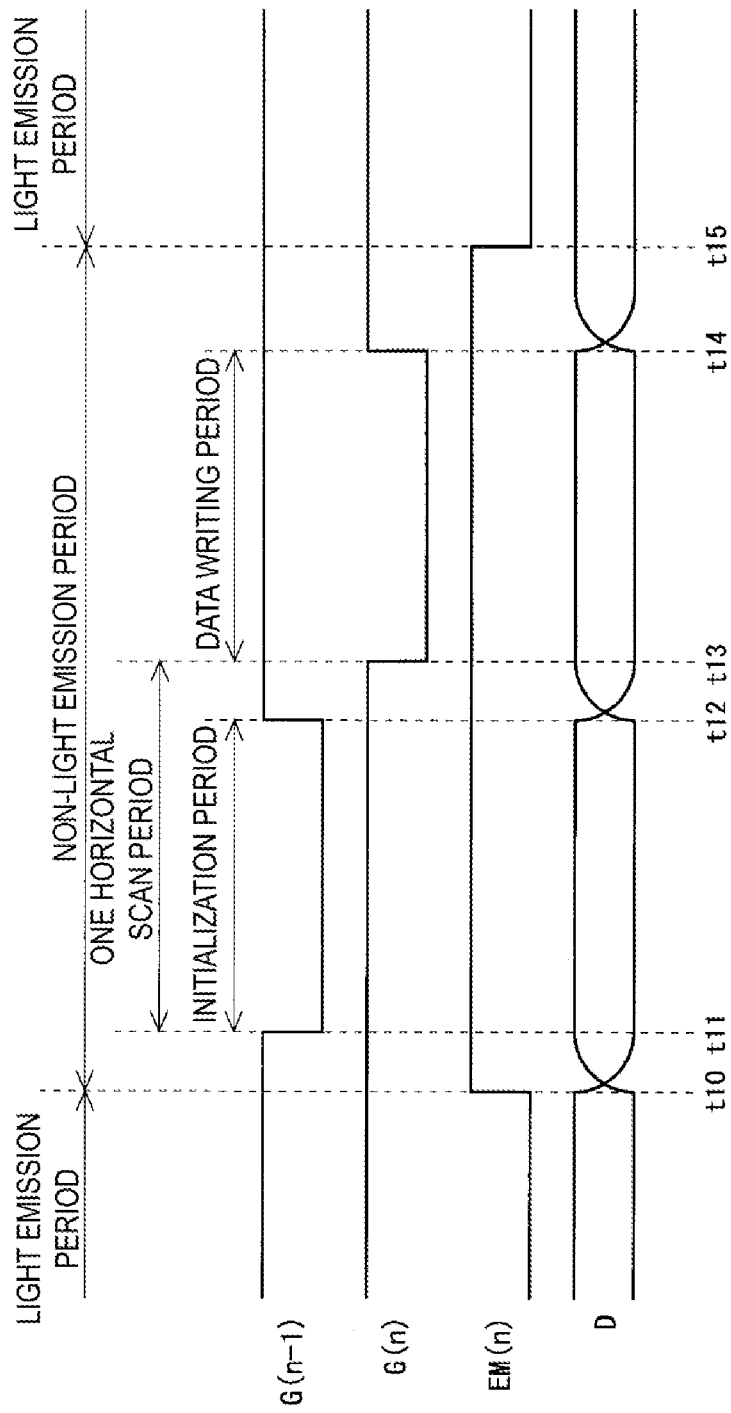
FIG. 21 is a timing chart for describing a driving method for a pixel circuit in the fourth embodiment.

Next, a driving method will be described. FIG. 21 is a timing chart for describing a driving method for the pixel circuit (the pixel circuit illustrated in FIG. 20) 10 located in the n-th row.

In the period before the time t10, a scanning signal G(n−1) and a scanning signal G(n) are at a high level, and a light emission control signal EM(n) is at a low level. At this time, the first light emission control transistor TB1, the second light emission control transistor TB2 and the second power supply control transistor TA2 are in an on state, while the first power supply control transistor TA1, the first writing control transistor TC, the first threshold voltage compensation transistor TD1, the second threshold voltage compensation transistor TD2, the second writing control transistor TE, and the initialization transistor TF are in an off state. As a result, a drive current of a size corresponding to the voltage between the first conduction terminal and the gate terminal of the drive transistor Tdr is supplied to the light-emitting element OLED, so that the light-emitting element OLED emits light.

At the time t10, the light emission control signal EM(n) is changed from the low level to the high level. This turns the first light emission control transistor TB1, the second light emission control transistor TB2, and the second power supply control transistor TA2 to the off state. As a result, the supply of the current to the light-emitting element OLED is blocked, so that the light-emitting element OLED is turned to the non-emitting (switch-off) state.

Figure 22:
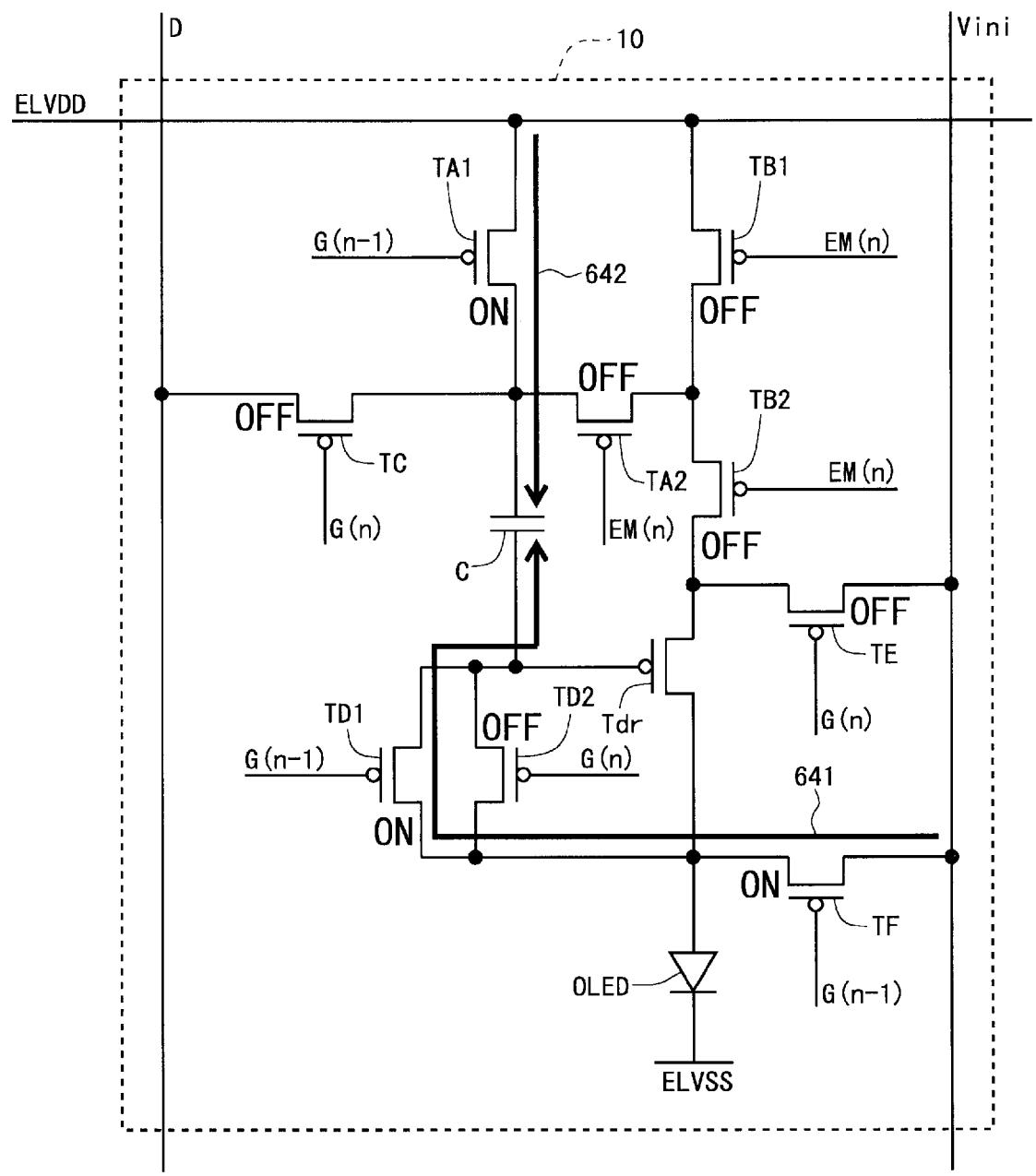
FIG. 22 is a diagram for describing actions in an initialization period in the fourth embodiment.

At the time t11, the scanning signal G(n−1) is changed from the high level to the low level. With this, as in the third embodiment, an initialization voltage Vini is applied to a first electrode of the data-holding capacitor C via the first threshold voltage compensation transistor TD1, as indicated by an arrow denoted by a reference sign 641 in FIG. 22. Similarly to the second embodiment, a high-level power supply voltage ELVDD is applied to a second electrode of the data-holding capacitor C (see an arrow denoted by a reference sign 642 in FIG. 22). As a result, a voltage of the magnitude of "ELVDD−Vini" is held in the data-holding capacitor C.

At the time t12, the scanning signal G(n−1) is changed from the low level to the high level. This turns the first power supply control transistor TA1, the first threshold voltage compensation transistor TD1 and the initialization transistor TF to the off state, and the initialization of the gate voltage of the drive transistor Tdr is completed.

Figure 23:
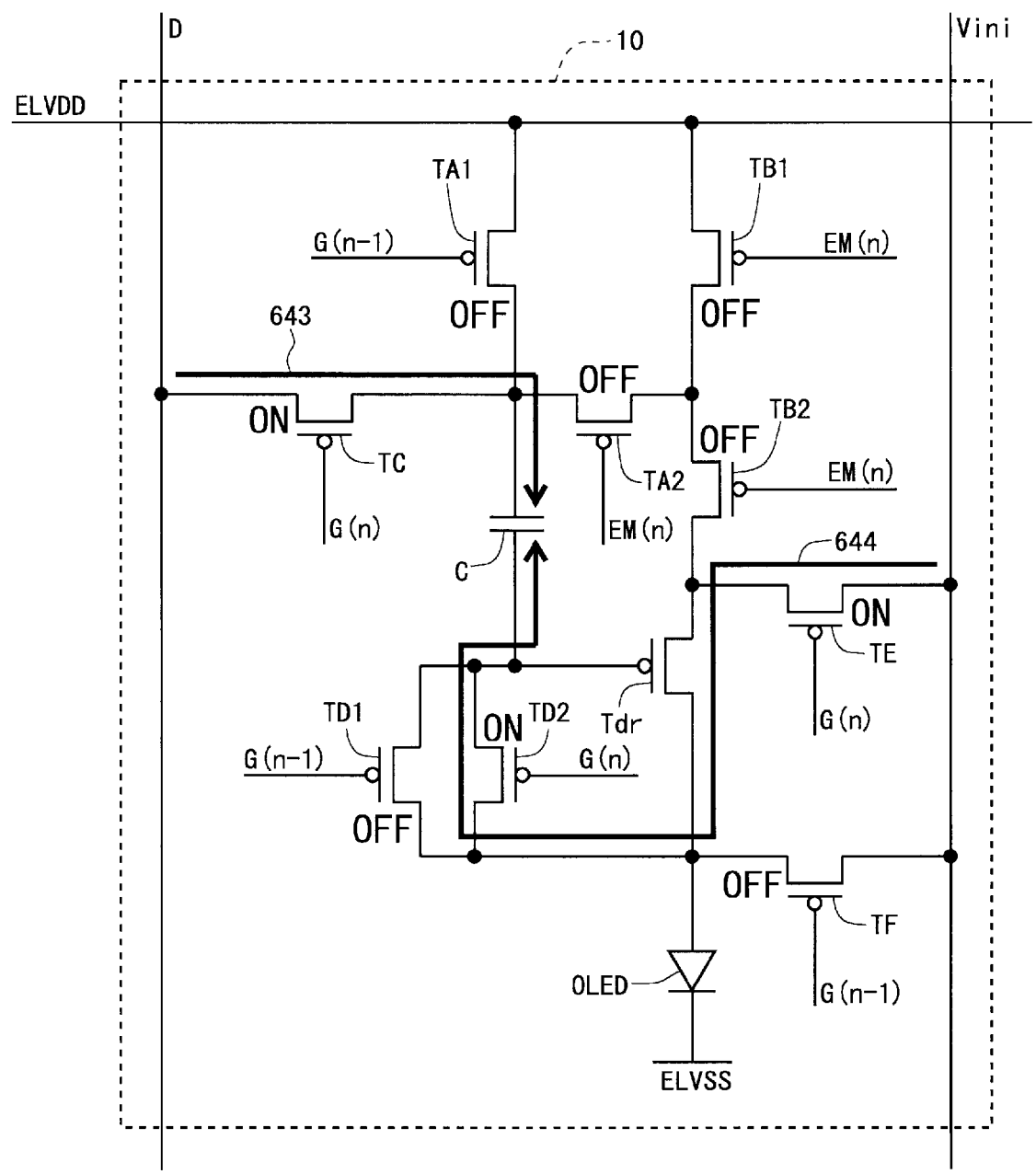
FIG. 23 is a diagram for describing actions in a data writing period in the fourth embodiment.

At the time t13, the scanning signal G(n) is changed from the high level to the low level. With this, a data voltage Vdata is applied to the second electrode of the data-holding capacitor C (see an arrow denoted by a reference sign 643 in FIG. 23), similarly to the first embodiment. Further, as in the third embodiment, a voltage of the magnitude of "°Vini−Vth" is applied to the first electrode of the data-holding capacitor C via the second threshold voltage compensation transistor TD2, as indicated by an arrow denoted by a reference sign 644 in FIG. 23. As a result, a voltage of the magnitude of "Vdata−(Vini−Vth)" is held in the data-holding capacitor C.

At the time t14, the scanning signal G(n) is changed from the low level to the high level. This turns the first writing control transistor TC, the second threshold voltage compensation transistor TD2, and the second writing control transistor TE to the off state, and the writing of the data is completed.

Figure 24:
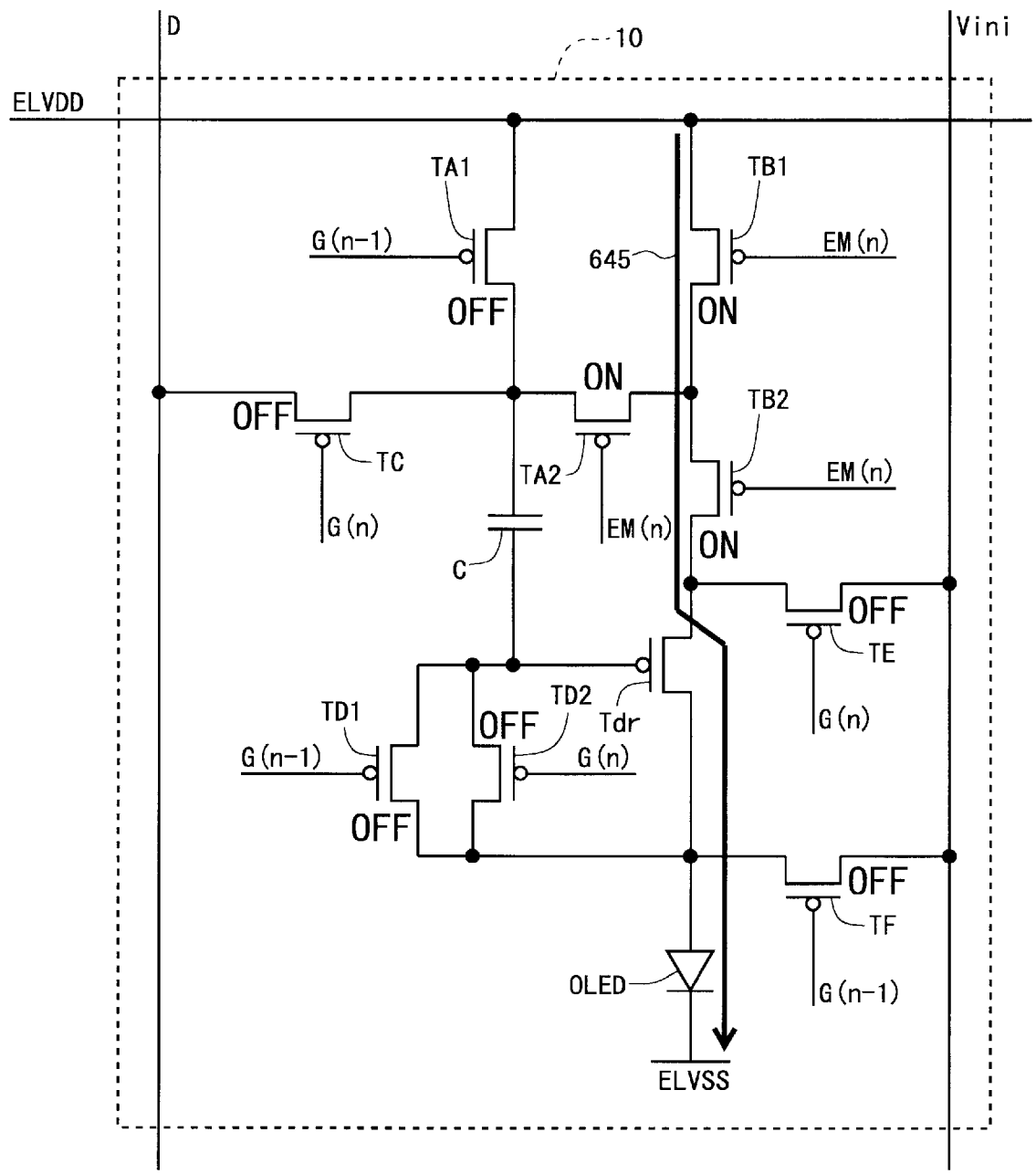
FIG. 24 is a diagram for describing actions in a light emission period in the fourth embodiment.

At the time t15, the light emission control signal EM(n) is changed from the high level to the low level. This turns the first light emission control transistor TB1, the second light emission control transistor TB2, and the second power supply control transistor TA2 to the on state. At this time, as in the second embodiment, the high-level power supply voltage ELVDD is supplied to the second electrode of the data-holding capacitor C via the first light emission control transistor TB1 and the second power supply control transistor TA2. With this, a drive current of a size corresponding to the voltage between the first conduction terminal and the gate terminal of the drive transistor Tdr is supplied to the light-emitting element OLED as indicated by an arrow denoted by a reference sign 645 in FIG. 24, so that the light-emitting element OLED emits light in accordance with the size of the drive current. A gate voltage Vg of the drive transistor Tdr, a voltage Vgs between the first conduction terminal and the gate terminal of the drive transistor Tdr, and a drive current Ioled during the light emission period are similar to those in the first embodiment. Thus, as in the first embodiment, a variation in the threshold voltage Vth of the drive transistor Tdr is compensated.

4.3 Effects

As in the first embodiment, also in the present embodiment, an organic EL display device able to compensate for the variation in the threshold voltage Vth of the drive transistor Tdr is achieved without causing a variation in luminance. Further, unlike the first embodiment, a signal (synthetic signal) representing a logical sum of the scanning signal G(n−1) and the light emission control signal EM(n), a signal (synthetic signal) representing a logical sum of the scanning signal G(n−1) and the scanning signal G(n), and the like are not required to be supplied into the pixel circuit 10. Because of this, the above-discussed first logical-sum signal wiring line (i first logical-sum signal wiring lines in the entirety of a display portion 100) and the above-discussed second logical-sum signal wiring line (i second logical-sum signal wiring lines in the entirety of the display portion 100) are unnecessary. Accordingly, it is possible to significantly reduce the number of control lines required to operate the pixel circuit 10 in comparison with the first embodiment. Further, as in the modification example of the second embodiment, even when a TFT of a single gate structure is employed for the first light emission control transistor TB1, the second light emission control transistor TB2, and the second power supply control transistor TA2, it is possible to sufficiently reduce the off-leak current. This makes it possible to reduce the total number of TFTs in the pixel circuit 10.

5. Supplement

Figure 25:
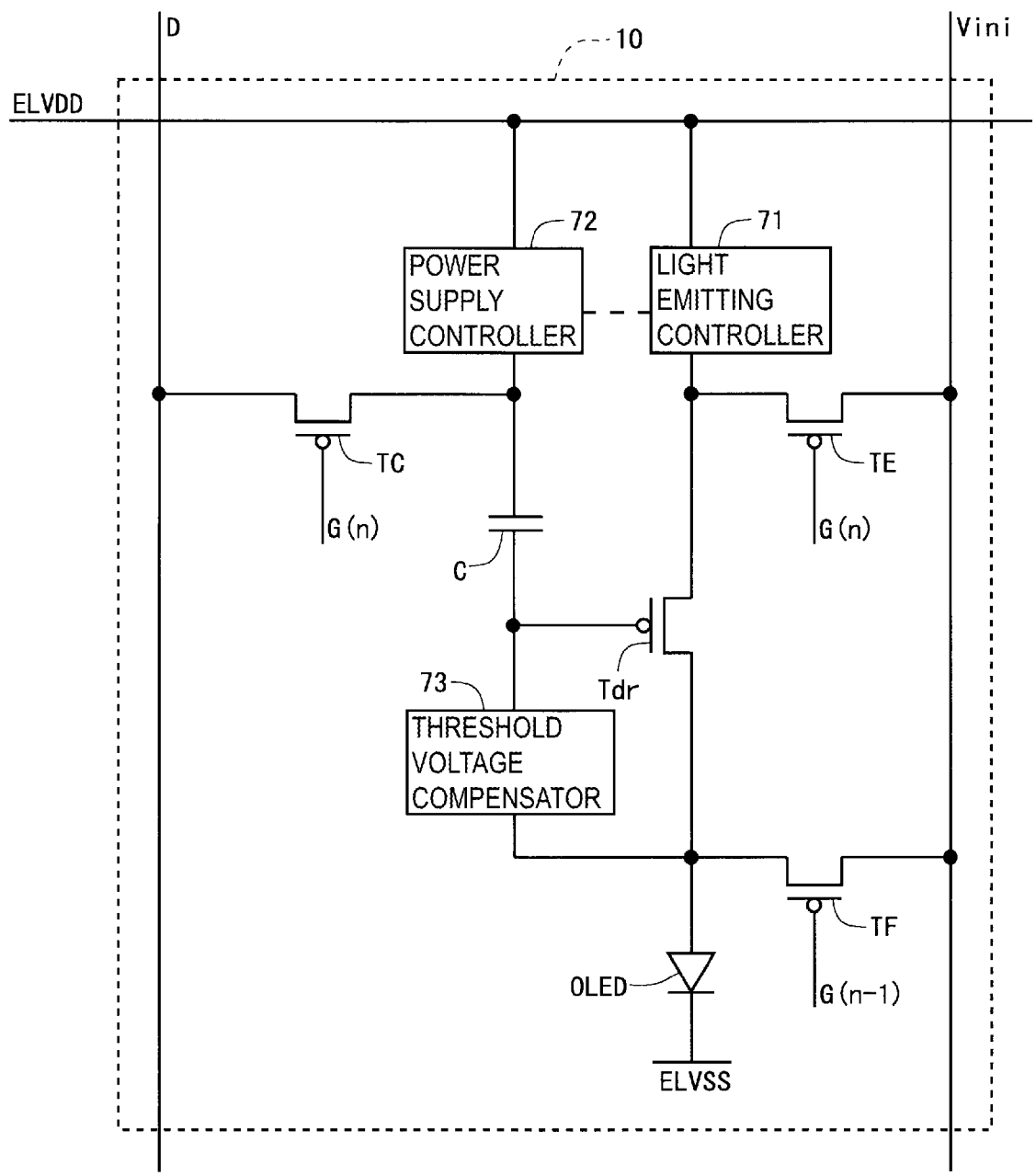
FIG. 25 is a diagram illustrating a configuration of a pixel circuit in which the first to fourth embodiments (including the modification example) are summarized.
Figure 26:
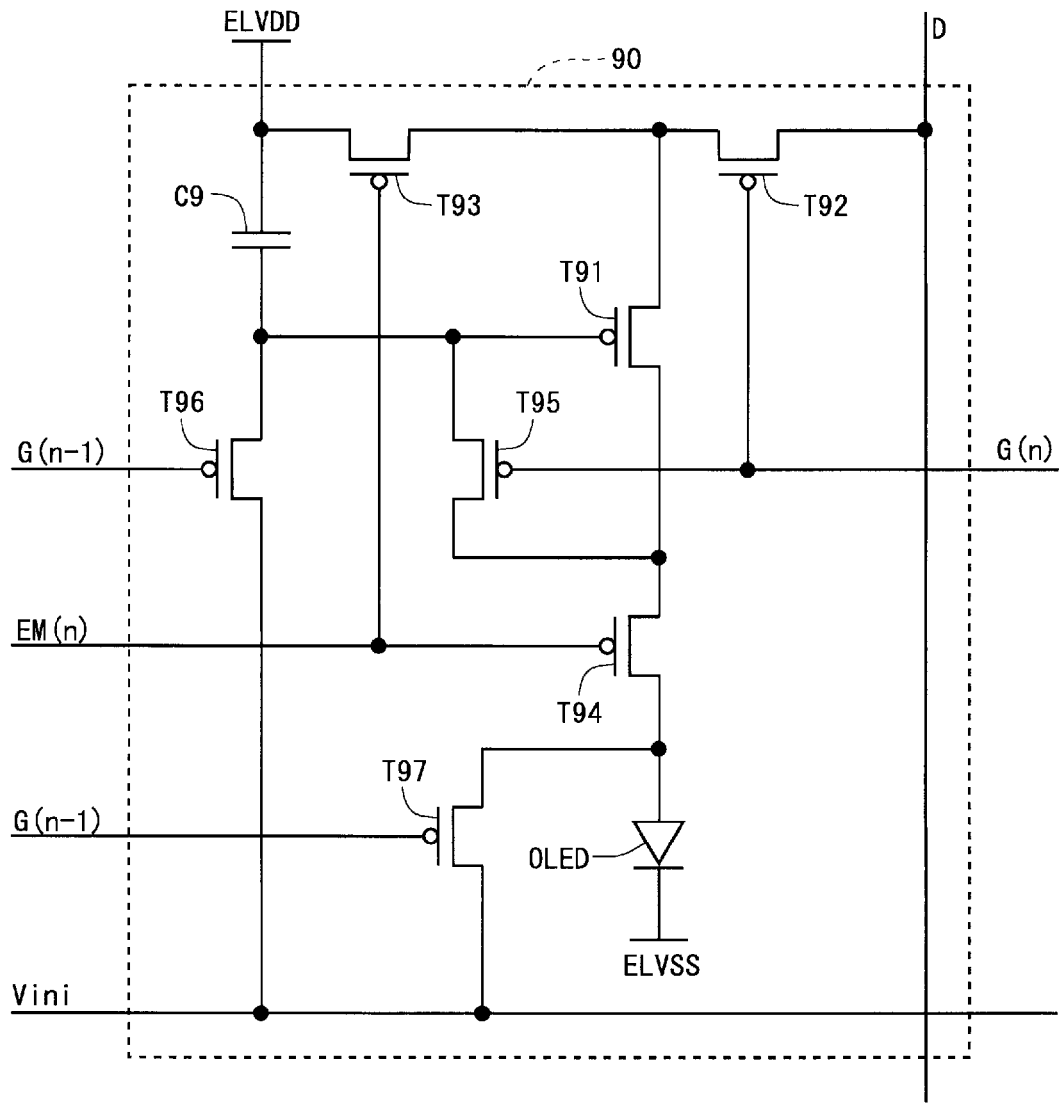
FIG. 26 is a circuit diagram illustrating a configuration of a known pixel circuit.
Figure 27:
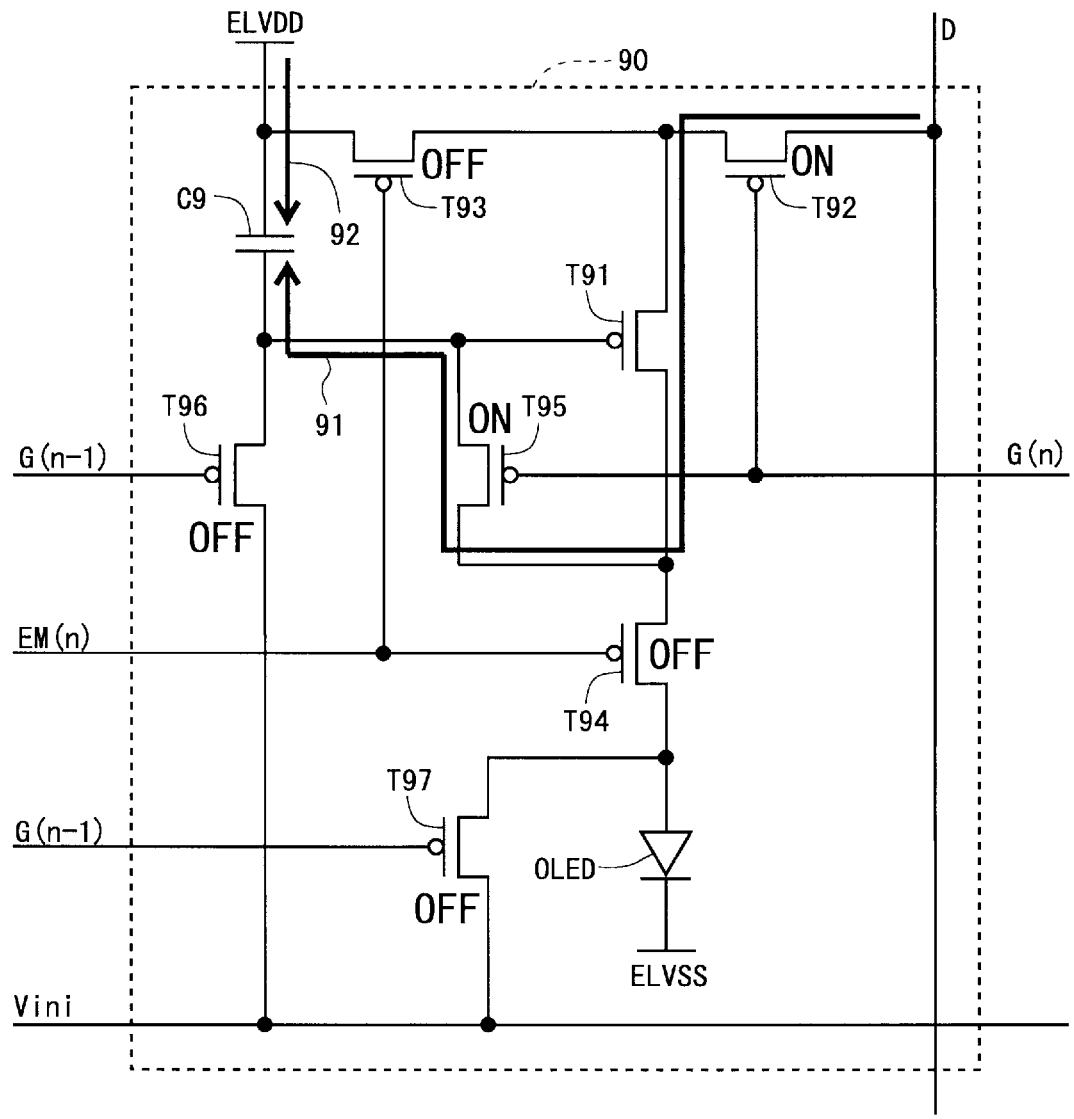
FIG. 27 is a diagram for describing actions of a known pixel circuit.

To summarize the contents described in the first to fourth embodiments (including the modification example), a pixel circuit 10 such as that described below may be employed (see FIG. 25).

The pixel circuit 10 includes:

a light-emitting element OLED, which is provided between a first power source wiring line supplied with a high-level power supply voltage ELVDD and a second power source wiring line supplied with a low-level power supply voltage ELVSS, and emits light with luminance in accordance with an amount of a current supplied;

a data-holding capacitor C having a first electrode and a second electrode;

a drive transistor Tdr, which is provided to be connected in series to the light-emitting element OLED between the first power source wiring line and the second power source wiring line, and has a gate terminal connected to the first electrode of the data-holding capacitor C, a first conduction terminal to be supplied with the high-level power supply voltage ELVDD during a light emission period, and a second conduction terminal that is electrically connected to the gate terminal during a data writing period, and is electrically disconnected from the gate terminal during a light emission period;

an initialization transistor TF having a gate terminal to be supplied with a signal that becomes active during an initialization period, a first conduction terminal connected to a wiring line between the gate terminal and the second conduction terminal of the drive transistor Tdr, and a second conduction terminal connected to an initialization power source wiring line;

a first writing control transistor TC having a gate terminal to be supplied with a signal that becomes active during a data writing period, a first conduction terminal connected to a data signal line DL, and a second conduction terminal connected to the second electrode of the data-holding capacitor C;

a second writing control transistor TE having a gate terminal to be supplied with a signal that becomes active during a data writing period, a first conduction terminal connected to the initialization power source wiring line, and a second conduction terminal connected to the first conduction terminal of the drive transistor Tdr;

a light emitting controller 71 configured to control a current supply to the light-emitting element OLED;

a power supply controller 72 configured to electrically connect the second electrode of the data-holding capacitor C and the first power source wiring line during an initialization period and a light emission period; and a threshold voltage compensator 73 configured to electrically connect the first electrode of the data-holding capacitor C and the initialization power source wiring line during an initialization period and a data writing period.

6. Other Matters

Although the above embodiments (including the modification example) are described while citing an example of an organic EL display device, types of display devices are not particularly limited. The disclosure may also be applied to an inorganic EL display device including an inorganic light emitting diode, a quantum dot light emitting diode (QLED) display device including a QLED, and the like, as a display

REFERENCE SIGNS LIST

10 Pixel circuit
100 Display portion
200 Display control circuit
300 Gate driver
400 Emission driver
500 Source driver
DL(1)-DL(j) Data signal line
GL(0)-GL(i) Scanning signal line
EML(1)-EML(i) Light emission control line
Tdr Drive transistor
TA Power supply control transistor
TA1 First power supply control transistor
TA2 Second power supply control transistor
TB Light emission control transistor
TB1 First light emission control transistor
TB2 Second light emission control transistor
TC First writing control transistor
TD Threshold voltage compensation transistor
TD1 First threshold voltage compensation transistor
TD2 Second threshold voltage compensation transistor
TE Second writing control transistor
TF Initialization transistor
D Data signal
G(1)-G(i) Scanning signal
EM(1)-EM(i) Light emission control signal
Vdata Data voltage
Vini Initialization voltage
ELVDD High-level power supply voltage
ELVSS Low-level power supply voltage

The invention claimed is:

1. A display device comprising:
a pixel circuit arranged in a matrix shape;
a first power source wiring line supplied with a first power supply voltage;
a second power source wiring line provided with a second power supply voltage;
an initialization power source wiring line supplied with an initialization voltage for initializing the pixel circuit; and
a data signal line provided for each column and supplied with a data voltage,
the pixel circuit including:
a display element that is provided between the first power source wiring line and the second power source wiring line, and emits light with luminance in accordance with an amount of a current supplied;
a capacitance element having a first electrode and a second electrode;
a drive transistor that is provided to be connected in series to the display element between the first power source wiring line and the second power source wiring line, and has a control terminal connected to the first electrode of the capacitance element, a first conduction terminal to be supplied with the first power supply voltage during a light emission period, and a second conduction terminal that is electrically connected to the control terminal during a data writing period, and is electrically disconnected from the control terminal during a light emission period;
an initialization transistor having a control terminal to be supplied with a signal that becomes active during an initialization period, a first conduction terminal connected to a wiring line between the control terminal and the second conduction terminal of the drive transistor, and a second conduction terminal connected to the initialization power source wiring line;
a first writing control transistor having a control terminal to be supplied with a signal that becomes active during a data writing period, a first conduction terminal connected to the data signal line, and a second conduction terminal connected to the second electrode of the capacitance element; and
a second writing control transistor having a control terminal to be supplied with a signal that becomes active during a data writing period, a first conduction terminal connected to the initialization power source wiring line, and a second conduction terminal connected to the first conduction terminal of the drive transistor.

2. The display device according to claim 1,
wherein the pixel circuit further includes
a light emitting controller configured to control a current supply to the display element,
a power supply controller configured to electrically connect the second electrode of the capacitance element and the first power source wiring line during an initialization period and a light emission period, and
a threshold voltage compensator configured to electrically connect the first electrode of the capacitance element and the initialization power source wiring line during an initialization period and a data writing period.

3. The display device according to claim 2,
wherein the light emitting controller is constituted of a light emission control transistor including a control terminal to be supplied with a signal that becomes active during a light emission period, a first conduction terminal connected to the first power source wiring line, and a second conduction terminal connected to the first conduction terminal of the drive transistor,
the power supply controller is constituted of a power supply control transistor including a control terminal to be supplied with a signal representative of a logical sum of a signal that becomes active during an initialization period and a signal that becomes active during a light emission period, a first conduction terminal connected to the first power source wiring line, and a second conduction terminal connected to the second electrode of the capacitance element, and
the threshold voltage compensator is constituted of a threshold voltage compensation transistor including a control terminal to be supplied with a signal representative of a logical sum of a signal that becomes active during an initialization period and a signal that becomes active during a data writing period, a first conduction terminal connected to the second conduction terminal of the drive transistor, and a second conduction terminal connected to the control terminal of the drive transistor.

4. The display device according to claim 2,
wherein the light emitting controller is constituted of a light emission control transistor including a control terminal to be supplied with a signal that becomes active during a light emission period, a first conduction terminal connected to the first power source wiring line, and a second conduction terminal connected to the first conduction terminal of the drive transistor,
the power supply controller is constituted of
a first power supply control transistor including a control terminal to be supplied with a signal that becomes active during an initialization period, a first conduction terminal connected to the first power source wiring line, and a second conduction terminal connected to the second electrode of the capacitance element, and a second power supply control transistor including a control terminal to be supplied with a signal that becomes active during a light emission period, a first conduction terminal connected to the second conduction terminal of the light emission control transistor, and a second conduction terminal connected to the second electrode of the capacitance element, and the threshold voltage compensator is constituted of a threshold voltage compensation transistor including a control terminal to be supplied with a signal representative of a logical sum of a signal that becomes active during an initialization period and a signal that becomes active during a data writing period, a first conduction terminal connected to the second conduction terminal of the drive transistor, and a second conduction terminal connected to the control terminal of the drive transistor.

5. The display device according to claim 2,
wherein the light emitting controller is constituted of
a first light emission control transistor including a control terminal to be supplied with a signal that becomes active during a light emission period, a first conduction terminal connected to the first power source wiring line, and a second conduction terminal, and a second light emission control transistor including a control terminal to be supplied with a signal that becomes active during a light emission period, a first conduction terminal connected to the second conduction terminal of the first light emission control transistor, and a second conduction terminal connected to the first conduction terminal of the drive transistor, the power supply controller is constituted of
a first power supply control transistor including a control terminal to be supplied with a signal that becomes active during an initialization period, a first conduction terminal connected to the first power source wiring line, and a second conduction terminal connected to the second electrode of the capacitance element, and a second power supply control transistor including a control terminal to be supplied with a signal that becomes active during a light emission period, a first conduction terminal connected to the second conduction terminal of the first light emission control transistor, and a second conduction terminal connected to the second electrode of the capacitance element, and the threshold voltage compensator is constituted of a threshold voltage compensation transistor including a control terminal to be supplied with a signal representative of a logical sum of a signal that becomes active during an initialization period and a signal that becomes active during a data writing period, a first conduction terminal connected to the second conduction terminal of the drive transistor, and a second conduction terminal connected to the control terminal of the drive transistor.

6. The display device according to claim 2,
wherein the light emitting controller is constituted of a light emission control transistor including a control terminal to be supplied with a signal that becomes active during a light emission period, a first conduction terminal connected to the first power source wiring line, and a second conduction terminal connected to the first conduction terminal of the drive transistor, the power supply controller is constituted of a power supply control transistor including a control terminal to be supplied with a signal representative of a logical sum of a signal that becomes active during an initialization period and a signal that becomes active during a light emission period, a first conduction terminal connected to the first power source wiring line, and a second conduction terminal connected to the second electrode of the capacitance element, and the threshold voltage compensator is constituted of
a first threshold voltage compensation transistor including a control terminal to be supplied with a signal that becomes active during an initialization period, a first conduction terminal connected to the second conduction terminal of the drive transistor, and a second conduction terminal connected to the control terminal of the drive transistor, and a second threshold voltage compensation transistor including a control terminal to be supplied with a signal that becomes active during a data writing period, a first conduction terminal connected to the second conduction terminal of the drive transistor, and a second conduction terminal connected to the control terminal of the drive transistor.

7. The display device according to claim 2,
wherein the light emitting controller is constituted of
a first light emission control transistor including a control terminal to be supplied with a signal that becomes active during a light emission period, a first conduction terminal connected to the first power source wiring line, and a second conduction terminal, and a second light emission control transistor including a control terminal to be supplied with a signal that becomes active during a light emission period, a first conduction terminal connected to the second conduction terminal of the first light emission control transistor, and a second conduction terminal connected to the first conduction terminal of the drive transistor, the power supply controller is constituted of
a first power supply control transistor including a control terminal to be supplied with a signal that becomes active during an initialization period, a first conduction terminal connected to the first power source wiring line, and a second conduction terminal connected to the second electrode of the capacitance element, and a second power supply control transistor including a control terminal to be supplied with a signal that becomes active during a light emission period, a first conduction terminal connected to the second conduction terminal of the first light emission control transistor, and a second conduction terminal connected to the second electrode of the capacitance element, and the threshold voltage compensator is constituted of
a first threshold voltage compensation transistor including a control terminal to be supplied with a signal that becomes active during an initialization period, a first conduction terminal connected to the second conduction terminal of the drive transistor, and a second conduction terminal connected to the control terminal of the drive transistor, and a second threshold voltage compensation transistor including a control terminal to be supplied with a signal that becomes active during a data writing period, a first conduction terminal connected to the second conduction terminal of the drive transistor, and a second conduction terminal connected to the control terminal of the drive transistor.

8. The display device according to claim 1,
wherein the display element is an organic EL element.

9. A driving method for a display device equipped with a pixel circuit including a display element that is provided between a first power source wiring line supplied with a first power supply voltage and a second power source wiring line supplied with a second power supply voltage, and emits light with luminance in accordance with an amount of a current supplied; a capacitance element having a first electrode and a second electrode; a drive transistor that is provided to be connected in series to the display element between the first power source wiring line and the second power source wiring line, and has a first conduction terminal, a second conduction terminal, and a control terminal connected to the first electrode of the capacitance element; and a light emitting controller configured to control a current supply to the display element, the driving method comprising:

supplying an initialization voltage to the control terminal of the drive transistor as initialization processing in a state of the current supply to the display element being blocked by the light emitting controller;

supplying a data voltage to the second electrode of the capacitance element as data writing processing while supplying the initialization voltage to the first electrode of the capacitance element via the drive transistor, in the state of the current supply to the display element being blocked by the light emitting controller; and electrically connecting the first power source wiring line and the second power source wiring line by the light emitting controller in such a manner as to supply the current to the display element, as light emission processing.

10. The driving method according to claim 9,
wherein the display device includes an initialization power source wiring line supplied with the initialization voltage, and a data signal line provided for each column and supplied with the data voltage, the pixel circuit is supplied with a first control signal, a second control signal, a third control signal, a fourth control signal, and a fifth control the light emitting controller is constituted of a light emission control transistor including a control terminal to be supplied with the third control signal, a first conduction terminal connected to the first power source wiring line, and a second conduction terminal connected to the first conduction terminal of the drive transistor, the pixel circuit further includes an initialization transistor having a control terminal to be supplied with the first control signal, a first conduction terminal connected to a wiring line between the control terminal and the second conduction terminal of the drive transistor, and a second conduction terminal connected to the initialization power source wiring line, a first writing control transistor having a control terminal to be supplied with the second control signal, a first conduction terminal connected to the data signal line, and a second conduction terminal connected to the second electrode of the capacitance element, a second writing control transistor having a control terminal to be supplied with the second control signal, a first conduction terminal connected to the initialization power source wiring line, and a second conduction terminal connected to the first conduction terminal of the drive transistor, a power supply control transistor having a control terminal to be supplied with the fifth control signal, a first conduction terminal connected to the first power source wiring line, and a second conduction terminal connected to the second electrode of the capacitance element, and a threshold voltage compensation transistor having a control terminal to be supplied with the fourth control signal, a first conduction terminal connected to the second conduction terminal of the drive transistor, and a second conduction terminal connected to the control terminal of the drive transistor, and the driving method further includes causing the first control signal, the fourth control signal and the fifth control signal to be active, and the second control signal and the third control signal to be non-active, in the initialization processing, causing the second control signal and the fourth control signal to be active, and the first control signal, the third control signal and the fifth control signal to be non-active, in the data writing processing, and causing the third control signal and the fifth control signal to be active, and the first control signal, the second control signal and the fourth control signal to be non-active, in the light emission processing.

11. The driving method according to claim 9,
wherein the display device includes an initialization power source wiring line supplied with the initialization voltage, and a data signal line provided for each column and supplied with the data voltage, the pixel circuit is supplied with a first control signal, a second control signal, a third control signal, and a fourth control signal, the light emitting controller is constituted of a light emission control transistor including a control terminal to be supplied with the third control signal, a first conduction terminal connected to the first power source wiring line, and a second conduction terminal connected to the first conduction terminal of the drive transistor, the pixel circuit further includes an initialization transistor having a control terminal to be supplied with the first control signal, a first conduction terminal connected to a wiring line between the control terminal and the second conduction terminal of the drive transistor, and a second conduction terminal connected to the initialization power source wiring line, a first writing control transistor having a control terminal to be supplied with the second control signal, a first conduction terminal connected to the data signal line, and a second conduction terminal connected to the second electrode of the capacitance element, a second writing control transistor having a control terminal to be supplied with the second control signal, a first conduction terminal connected to the initialization power source wiring line, and a second conduction terminal connected to the first conduction terminal of the drive transistor, a first power supply control transistor having a control terminal to be supplied with the first control signal, a first conduction terminal connected to the first power source wiring line, and a second conduction terminal connected to the second electrode of the capacitance element, a second power supply control transistor having a control terminal to be supplied with the third control signal, a first conduction terminal connected to the second conduction terminal of the light emission control transistor, and a second conduction terminal connected to the second electrode of the capacitance element, and a threshold voltage compensation transistor having a control terminal to be supplied with the fourth control signal, a first conduction terminal connected to the second conduction terminal of the drive transistor, and a second conduction terminal connected to the control terminal of the drive transistor, and the driving method further includes causing the first control signal and the fourth control signal to be active, and the second control signal and the third control signal to be non-active, in the initialization processing, causing the second control signal and the fourth control signal to be active, and the first control signal and the third control signal to be non-active, in the data writing processing, and causing the third control signal to be active, and the first control signal, the second control signal and the fourth control signal to be non-active, in the light emission processing.

12. The driving method according to claim 9, wherein the display device includes an initialization power source wiring line supplied with the initialization voltage, and a data signal line provided for each column and supplied with the data voltage, the pixel circuit is supplied with a first control signal, a second control signal, a third control signal, and a fourth control signal, the light emitting controller is constituted of a first light emission control transistor including a control terminal to be supplied with the third control signal, a first conduction terminal connected to the first power source wiring line, and a second conduction terminal, and a second light emission control transistor including a control terminal to be supplied with the third control signal, a first conduction terminal connected to the second conduction terminal of the first light, emission control transistor, and a second conduction terminal connected to the first conduction terminal of the drive transistor, the pixel circuit further includes an initialization transistor having a control terminal to be supplied with the first control signal, a first conduction terminal connected to a wiring line between the control terminal and the second conduction terminal of the drive transistor, and a second conduction terminal connected to the initialization power source wiring line, a first writing control transistor having a control terminal to be supplied with the second control signal, a first conduction terminal connected to the data signal line, and a second conduction terminal connected to the second electrode of the capacitance element, a second writing control transistor having a control terminal to be supplied with the second control signal, a first conduction terminal connected to the initialization power source wiring line, and a second conduction terminal connected to the first conduction terminal of the drive transistor, a first power supply control transistor having a control terminal to be supplied with the first control signal, a first conduction terminal connected to the first power source wiring line, and a second conduction terminal connected to the second electrode of the capacitance element, a second power supply control transistor having a control terminal to be supplied with the third control signal, a first conduction terminal connected to the second conduction terminal of the first light emission control transistor, and a second conduction terminal connected to the second electrode of the capacitance element, and a threshold voltage compensation transistor having a control terminal to be supplied with the fourth control signal, a first conduction terminal connected to the second conduction terminal of the drive transistor, and a second conduction terminal connected to the control terminal of the drive transistor, and the driving method further includes causing the first control signal and the fourth control signal to be active, and the second control signal and the third control signal to be non-active, in the initialization processing, causing the second control signal and the fourth control signal to be active, and the first control signal and the third control signal to be non-active, in the data writing processing, and causing the third control signal to be active, and the first control signal, the second control signal and the fourth control signal to be non-active, in the light emission processing.

13. The driving method according to claim wherein the display device includes an initialization power source wiring line supplied with the initialization voltage, and a data signal line provided for each column and supplied with the data voltage, the pixel circuit is supplied with a first control signal, a second control signal, a third control signal, and a fifth control signal, the light emitting controller is constituted of a light emission control transistor including a control terminal to be supplied with the third control signal, a first conduction terminal connected to the first power source wiring line, and a second conduction terminal connected to the first conduction terminal of the drive transistor, the pixel circuit further includes an initialization transistor having a control terminal to be supplied with the first control signal, a first conduction terminal connected to a wiring line between the control terminal and the second conduction terminal of the drive transistor, and a second conduction terminal connected to the initialization power source wiring line, a first writing control transistor having a control terminal to be supplied with the second control signal, a first conduction terminal connected to the data signal line, and a second conduction terminal connected to the second electrode of the capacitance element, a second writing control transistor having a control terminal to be supplied with the second control signal, a first conduction terminal connected to the initialization power source wiring line, and a second conduction terminal connected to the first conduction terminal of the drive transistor, a power supply control transistor having a control terminal to be supplied with the fifth control signal, a first conduction terminal connected to the first power source wiring line, and a second conduction terminal connected to the second electrode of the capacitance element, a first threshold voltage compensation transistor having a control terminal to be supplied with the first control signal, a first conduction terminal connected to the second conduction terminal of the drive transistor, and a second conduction terminal connected to the control terminal of the drive transistor, and a second threshold voltage compensation transistor having a control terminal to be supplied with the second control signal, a first conduction terminal connected to the second conduction terminal of the drive transistor, and a second conduction terminal connected to the control terminal of the drive transistor, and the driving method further includes causing the first control signal and the fifth control signal to be active, and the second control signal and the third control signal to be non-active, in the initialization processing, causing the second control signal to be active, and the first control signal, the third control signal and the fifth control signal to be non-active, in the data writing processing, and causing the third control signal and the fifth control signal to be active, and the first control signal and the second control signal to be non-active, in the light emission processing.

14. The driving method according to claim wherein the display device includes an initialization power source wiring line supplied with the initialization voltage, and a data signal line provided for each column and supplied with the data voltage, the pixel circuit is supplied with a first control signal, a second control signal, and a third control signal, the light emitting controller is constituted of a first light emission control transistor including a control terminal to be supplied with the third control signal, a first conduction terminal connected to the first power source wiring line, and a second conduction terminal, and a second light emission control transistor including a control terminal to be supplied with the third control signal, a first conduction terminal connected to the second conduction terminal of the first light emission control transistor, and a second conduction terminal connected to the first conduction terminal of the drive transistor, the pixel circuit further includes an initialization transistor having a control terminal to be supplied with the first control signal, a first conduction terminal connected to a wiring line between the control terminal and the second conduction terminal of the drive transistor, and a second conduction terminal connected to the initialization power source wiring line, a first writing control transistor having a control terminal to be supplied with the second control signal, a first conduction terminal connected to the data signal line, and a second conduction terminal connected to the second electrode of the capacitance element, a second writing control transistor having a control terminal to be supplied with the second control signal, a first conduction terminal connected to the initialization power source wiring line, and a second conduction terminal connected to the first conduction terminal of the drive transistor, a first power supply control transistor having a control terminal to be supplied with the first control signal, a first conduction terminal connected to the first power source wiring line, and a second conduction terminal connected to the second electrode of the capacitance element, a second power supply control transistor having a control terminal to be supplied with the third control signal, a first conduction terminal connected to the second conduction terminal of the first light emission control transistor, and a second conduction terminal connected to the second electrode of the capacitance element, a first threshold voltage compensation transistor having a control terminal to be supplied with the first control signal, a first conduction terminal connected to the second conduction terminal of the drive transistor, and a second conduction terminal connected to the control terminal of the drive transistor, and a second threshold voltage compensation transistor having a control terminal to be supplied with the second control signal, a first conduction terminal connected to the second conduction terminal of the drive transistor, and a second conduction terminal connected to the control terminal of the drive transistor, and the driving method further includes causing the first control signal to be active, and the second control signal and the third control signal to be non-active, in the initialization processing, causing the second control signal to be active, and the first control signal and the third control signal to be non-active, in the data writing processing, and causing the third control signal to be active, and the first control signal and the second control signal to be non-active, in the light emission processing.

* * * * *